US 7,767,952 B2

(12) United States Patent
Ohkawa

(10) Patent No.: US 7,767,952 B2
(45) Date of Patent: Aug. 3, 2010

(54) SEMICONDUCTOR IMAGING DEVICE HAVING A PLURALITY OF PIXELS ARRANGED IN A MATRIX-LIKE PATTERN

(75) Inventor: Narumi Ohkawa, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/482,207

(22) Filed: Jun. 10, 2009

(65) Prior Publication Data

US 2009/0242739 A1 Oct. 1, 2009

Related U.S. Application Data

(62) Division of application No. 11/401,425, filed on Apr. 11, 2006, now Pat. No. 7,560,678.

(30) Foreign Application Priority Data

Dec. 28, 2005 (JP) ............................. 2005-378115

(51) Int. Cl.
*H01L 27/00* (2006.01)
*H04N 3/14* (2006.01)
(52) U.S. Cl. ................................. 250/208.1; 348/308
(58) Field of Classification Search ............. 250/208.1; 257/291, 292; 348/301, 304, 308
See application file for complete search history.

(56) References Cited

U.S. PATENT DOCUMENTS

2006/0027843 A1* 2/2006 Ogura et al. ................ 257/291

2006/0028569 A1 2/2006 Sekine

FOREIGN PATENT DOCUMENTS

| CN | 1731585 A | 2/2006 |
|---|---|---|
| EP | 1 592 066 A2 | 11/2005 |
| JP | 2000-232216 A | 8/2000 |
| JP | 2001-298177 A | 10/2001 |

(Continued)

OTHER PUBLICATIONS

Takahashi et al. "A 3.9 μm Pixel Pitch VGA Format 10b Digital Image Sensor with 1.5-Transistor/Pixel" 2004 IEEE International Solid-State Circuits Conference (IEEE cat. No. 04CH37519), IEEE Piscataway, NJ, USA, vol. 1, 2004, pp. 108-516, vol. 1, XP002424883.

(Continued)

*Primary Examiner*—Thanh X Luu
(74) *Attorney, Agent, or Firm*—Westerman, Hattori, Daniels & Adrian, LLP

(57) ABSTRACT

A semiconductor imaging device having a plurality of pixels arranged in a matrix-like pattern, each of the pixels including a first photoelectric conversion unit, a second photoelectric conversion unit, a third photoelectric conversion unit and a forth photoelectric conversion unit for converting received light into signal charge; a first signal voltage conversion unit and a second voltage conversion unit for converting the signal charge into voltage; a first transistor for controlling the signal charge to be transferred from the first photoelectric conversion unit, the second photoelectric conversion unit, the third photoelectric conversion unit and the forth photoelectric conversion unit to the first signal voltage conversion unit and the second voltage conversion unit; and a signal voltage read-out unit having second, third and forth transistors.

6 Claims, 25 Drawing Sheets

FOREIGN PATENT DOCUMENTS

JP        2004-186407 A        7/2004

OTHER PUBLICATIONS

Yamawaki et al. "A Pixel Size Shrinkage of Amplified MOS Imager with Two-Line Mixing" IEEE Transactions on Electron Devices, IEEE Service Center, Piscataway, NJ, USA, vol. 43, pp. 713-719, No. 5, May 1996, XP011015813.

Communication dated Mar. 28, 2007 issued in corresponding European Application No. EP 06 25 1928.

Chinese Office Action dated Aug. 1, 2008, issued in corresponding Chinese Appln. No. 2006100777082.

* cited by examiner

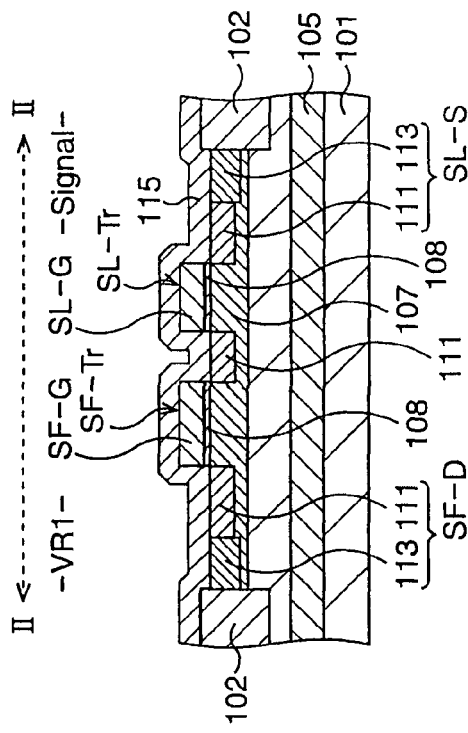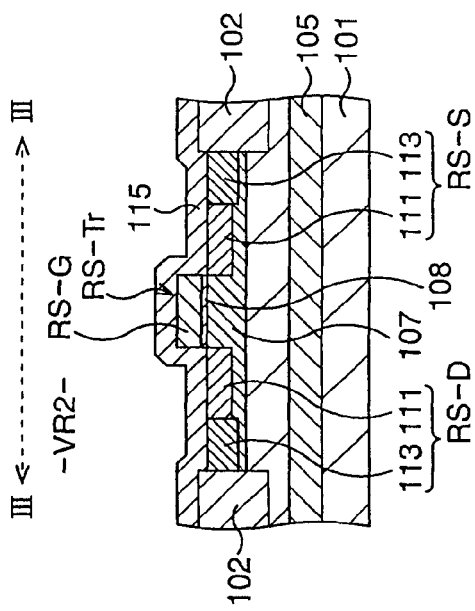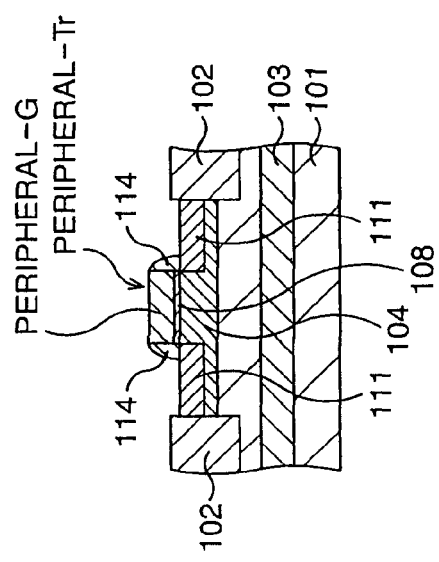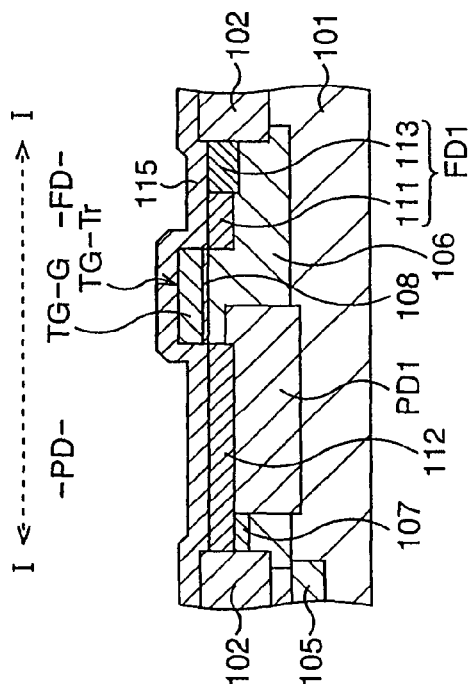

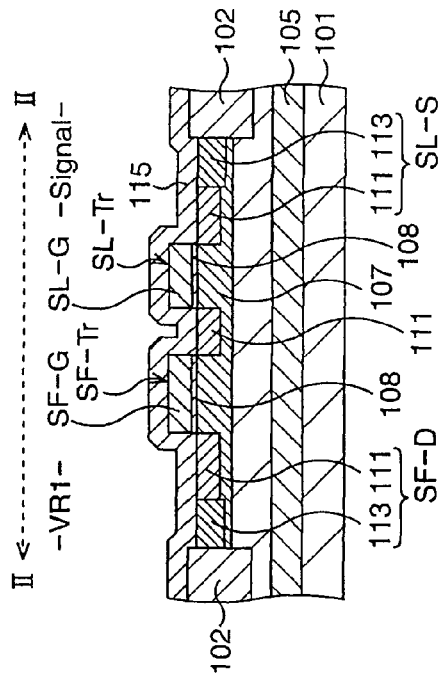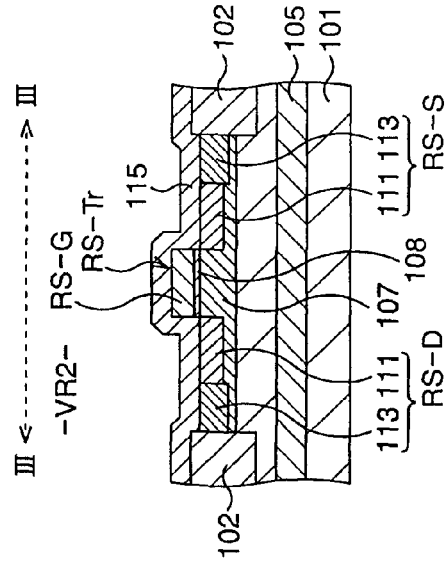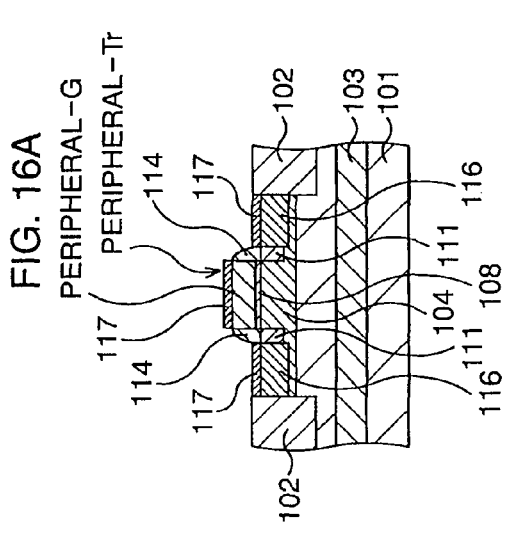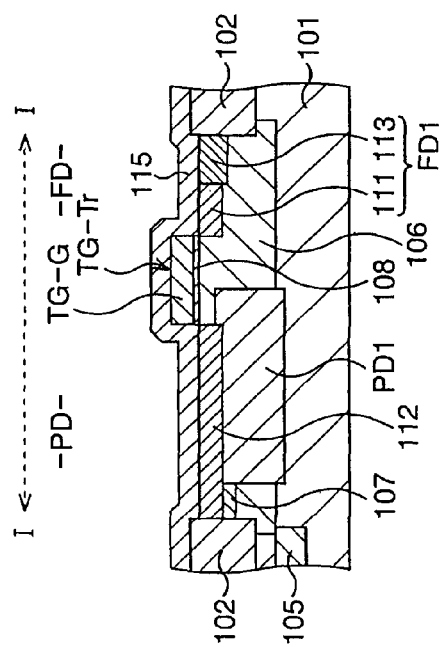

SEMICONDUCTOR IMAGING DEVICE HAVING A PLURALITY OF PIXELS ARRANGED IN A MATRIX-LIKE PATTERN

CROSS-REFERENCE TO RELATED APPLICATIONS

This application is a divisional of application Ser. No. 11/401,425, filed on Apr. 11, 2006, which is based upon and claims the benefit of priority from the prior Japanese Patent Application No. 2005-378115, filed on Dec. 28, 2005, the entire contents of which are incorporated herein by reference.

BACKGROUND OF THE INVENTION

1. Field of the Invention

The present invention relates to a semiconductor imaging device having a plurality of pixels arranged in a matrix-like pattern.

2. Description of the Related Art

Generally, semiconductor imaging elements are classified broadly into CCD image sensors and CMOS image sensors. As one type of CMOS image sensors, there exists a 4Tr+1PD type 4Tr-APS (Active Pixel Sensor) including four transistors and one photodiode (PD) which form a single pixel.

The structure of a pixel composing the 4Tr-APS is shown in FIGS. 24A and 24B.

In the 4Tr-APS, as shown in FIG. 24A, a photodiode (PD) photoelectrically converts the received light by means of NP junction and accumulates a generated signal charge (electron) in an N-type diffusion layer. Floating diffusion (FD) layer constitutes a capacitance for converting the signal charge transferred from the PD into voltage. A transfer gate transistor (TG-Tr) controls the transferring of the signal charge from the PD to the FD. A reset transistor (RS-Tr) resets the voltage of the FD to a reset voltage Vr. A source follower transistor (SF-Tr) outputs a signal voltage according to the voltage of the FD (varies with the signal charge). A select transistor (SL-Tr) exists for selecting the row to which the pixel belongs.

In each of the pixels, as shown in FIG. 24B, a TG line connected to the gate electrode of the TG-Tr, an RS line connected to the gate electrode of the RS-Tr, and an SL line connected to the gate electrode of the SL-Tr are respectively provided in alignment along the row direction, while a Vr line providing reset voltage Vr and an SG line connected to the source electrode of the SF-Tr for reading the signal voltage are respectively provided in alignment along the column direction. Each of the pixels is selected per row by the TG, SL, and RS lines to read the signal voltage.

An exemplary operation sequence of the 4Tr-APS is shown in FIG. 25.

When a row is selected (SL-Tr turned ON), the RST-Tr first turns ON with the TG-Tr remaining OFF, then the FD is reset, and a signal voltage according to the voltage of the FD is read as noise (N). Next, following the ON/OFF switching of the TG-Tr, the signal charge is transferred from the PD to the FD. In the FD, the voltage drops by an extent corresponding to the signal charge transferred from the PD, and signal voltage according to the voltage is output from SF-Tr as a signal (S).

Today, there is a rising demand for downsizing/miniaturization of 4Tr-APS too, with proposals being made for sharing elements between adjacent pixels.

For example, Patent Document 1 discloses a technique of sharing a signal voltage reading unit (composed of an SF-Tr, an RS-Tr, and an SL-Tr) between 2*2 adjacent PDs and 2*4 PDs.

In addition, Patent Document 2 discloses a technique of sharing the signal voltage reading unit between two PDs along the column direction and a technique of sharing the signal voltage reading unit between four PDs along the column direction. In the latter case, specifically, the four PDs (PD1 to PD4) which are adjacent along the column direction are disposed in the order of PD1/FD1/PD2/signal voltage reading unit/PD3/FD2/PD4.

[Patent Document 1] Japanese Patent Application Laid-open No. 2000-232216

[Patent Document 2] Japanese Patent Application Laid-open No. 2001-298177

However, the conventional art stated above has serious problems as described below.

With Patent Document 1, since the transistors of the signal voltage reading unit are disposed between adjacent PDs along the column direction as well as between adjacent PDs along the row direction for respective PDs, they occupy a considerably large area as a pixel array. Therefore, in this case, the 4Tr-APS cannot be sufficiently downsized/miniaturized.

Thus, expectations are arising for a technique for sharing the signal voltage reading unit between four PDs which are adjacent along the column direction. However, in the case of Patent Document 2, sufficient downsizing cannot be achieved, in the first place, according to the technique for sharing the signal voltage reading unit between two PDs along the column direction. Additionally, with the technique for sharing a signal voltage reading unit between four PDs along the column direction, although it is not necessary to dispose the transistor of the signal voltage reading unit between PDs which are adjacent along the row direction, there may be a portion where the PDs are unevenly disposed in terms of a pixel array. In this case, respective PDs may have different light receiving conditions, making correct imaging operation difficult. In addition, a problem arises in that signal voltage variation may occur because the signal voltage reading unit is disposed between adjacent PDs and necessarily, the area to be occupied by the signal voltage reading unit must be reduced.

SUMMARY OF THE INVENTION

It is an object of the present invention, contrived in view of the above-mentioned problems, to provide a compact and highly reliable semiconductor imaging device, with the device intended to be downsized/miniaturized by employing an arrangement for sharing the signal voltage reading unit between four photoelectric conversion units, while realizing a highly precise reading operation by disposing respective photoelectric conversion units at intervals as even as possible to suppress signal voltage variation.

The semiconductor imaging device of the present invention has a plurality of pixels arranged in a matrix-like pattern, each of the pixels including a photoelectric conversion unit for converting received light into signal charge; a signal voltage conversion unit for converting the signal charge into voltage; a first transistor for controlling the signal charge to be transferred from the photoelectric conversion unit to the signal voltage conversion unit; a signal voltage reading unit having a second transistor for regulating voltage of the signal voltage conversion unit into a second reset voltage, a third transistor for outputting signal voltage according to the voltage of the signal voltage conversion unit, and a fourth transistor for selecting a row to which the pixel belongs, wherein four photoelectric conversion units aligned along the column direction share the signal voltage reading unit, with the elements disposed in the order of: the photoelectric conversion unit/the signal voltage conversion unit and two of the first transistors/the photoelectric conversion unit/the third transistor and the fourth transistor/the photoelectric conversion unit/ the signal voltage conversion unit and two of the first transistors/the photoelectric conversion unit/the second transistor.

The semiconductor imaging device of the present invention has a plurality of pixels arranged in a matrix-like pattern, each of the pixels including a photoelectric conversion unit for converting received light into signal charge; a signal voltage conversion unit for converting the signal charge into voltage; a first transistor for controlling the signal charge to be transferred from the photoelectric conversion unit to the signal voltage conversion unit; a signal voltage reading unit having a second transistor for regulating voltage of the signal voltage conversion unit into a second reset voltage, a third transistor for outputting signal voltage according to the voltage of the signal voltage conversion unit, and a fourth transistor for selecting a row to which the pixel belongs, wherein four photoelectric conversion units aligned along the column direction share the signal voltage reading unit, with the elements disposed in the order of: the photoelectric conversion unit/the signal voltage conversion unit and two of the first transistors/the photoelectric conversion unit/the second transistor/the photoelectric conversion unit/the signal voltage conversion unit and two of the first transistors/the photoelectric conversion unit/the third transistor and the fourth transistor.

BRIEF DESCRIPTION OF THE DRAWINGS

FIGS. 15A to 15D are schematic cross-sectional views illustrating, subsequent to FIGS. 14A to 14D, the manufacturing method of the CMOS image sensor according to the present embodiment in the order of processing.

FIGS. 16A to 16D are schematic cross-sectional views illustrating, subsequent to FIGS. 15A to 15D, the manufacturing method of the CMOS image sensor according to the present embodiment in the order of processing.

DETAILED DESCRIPTION OF THE PREFERRED EMBODIMENTS

Basic Gist of the Present Invention

The inventor has conceived, as a result of endeavors to dispose respective PDs approximately at even intervals while assuring a certain amount of area to be occupied by the signal voltage reading unit, a technical concept of suitably distributing the SF-Tr, RS-Tr, and SL-Tr which compose the signal voltage reading unit between adjacent PDs.

Specifically, in an arrangement wherein four PDs (PD1 to PD4) aligned along the column direction share the signal voltage reading unit, respective elements are disposed in the order of PD1/FD1 and TG-Tr1, 2/PD2/SF-Tr and SL-Tr/PD3/ FD2, and TG-Tr3, 4/PD4/RS-Tr.

Alternatively, respective elements are disposed in the order of PD1/FD1 and TG-Tr1, 2/PD2/RS-Tr/PD3/FD2 and TG-Tr3, 4/PD4/SF-Tr and SL-Tr.

By disposing respective elements as described above, "an FD and two TG-Trs" or "a composing element of the signal voltage reading unit" will be inserted between all of the adjacent PDs, which are disposed along the column direction, when a plurality of PDs are arranged in a matrix-like pattern. In other words, respective PDs are disposed at intervals as even as possible. By employing such an arrangement, light receiving condition can be averaged for respective PDs, whereby enabling correct imaging operation. Furthermore, since each of composing elements of the signal voltage reading unit is suitably distributed as two groups, the area occupied by each of composing elements can be larger than the case where each of composing elements of the signal voltage reading unit is integrated in a single location. Thus, signal voltage variation can be suppressed.

Specific Embodiments Applying the Present Invention

Specific embodiments applying the present invention will be described in detail below, referring to the accompanying drawings.

First Embodiment

Overall Arrangement of the CMOS Image Sensor

Figure 1:
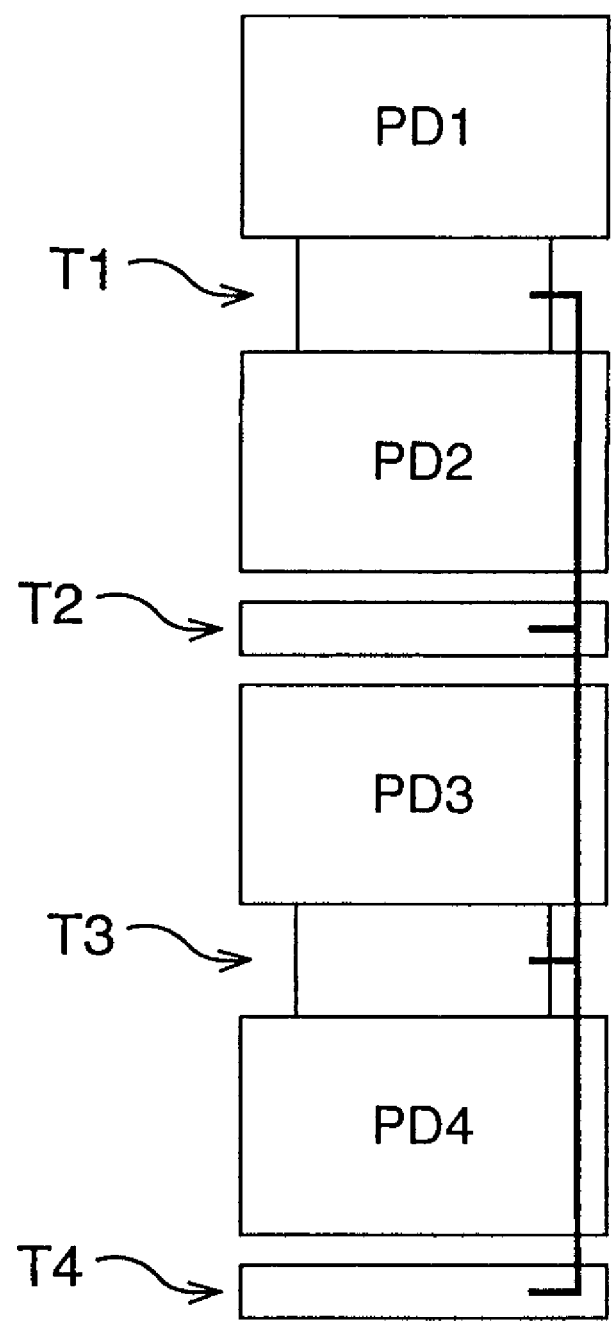
FIG. 1 is a schematic view illustrating a basic structure of the CMOS image sensor according to the first embodiment.
Figure 2:
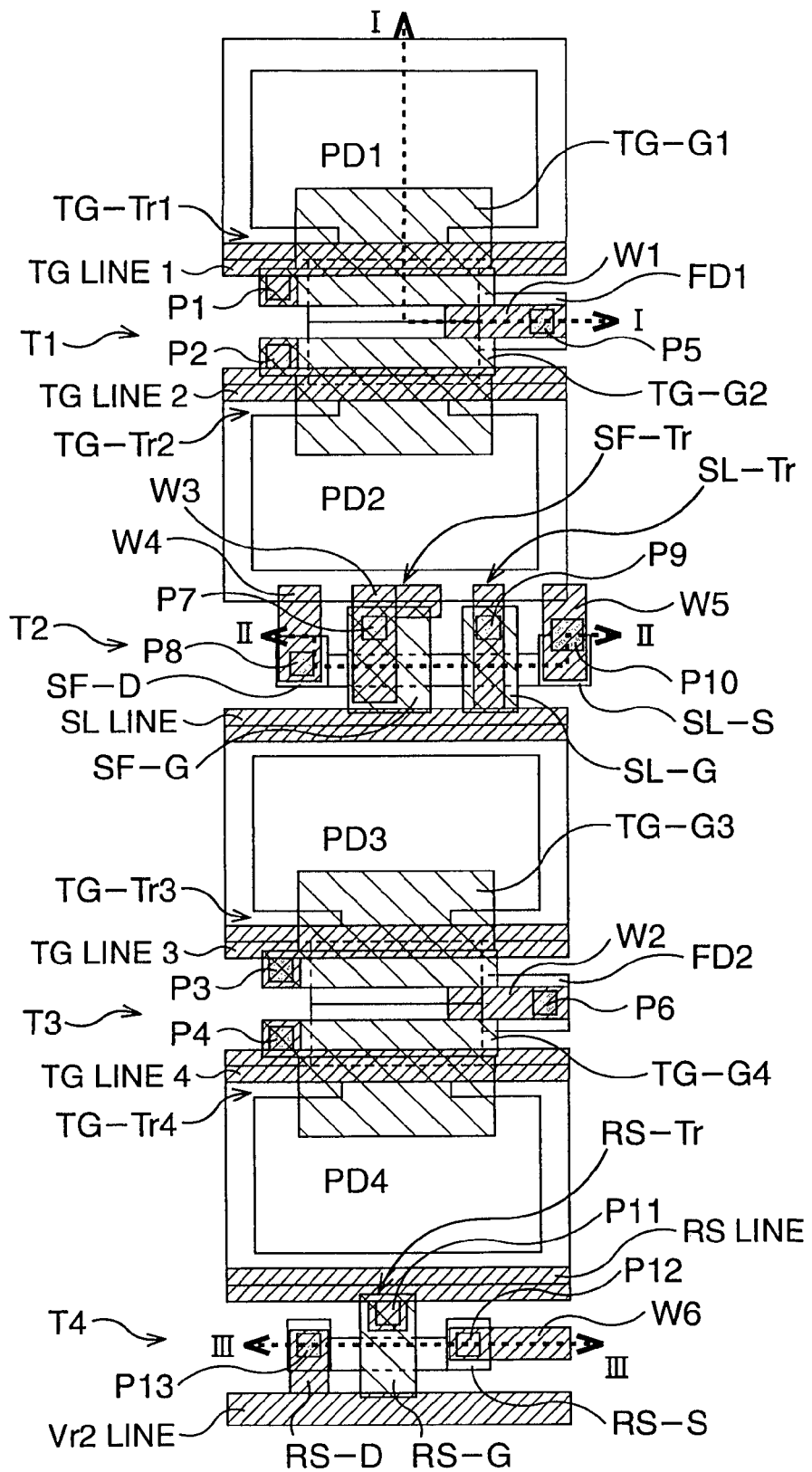
FIG. 2 is a schematic plan view illustrating, in detail, the arrangement of the sensor unit of FIG. 1.
Figure 3:
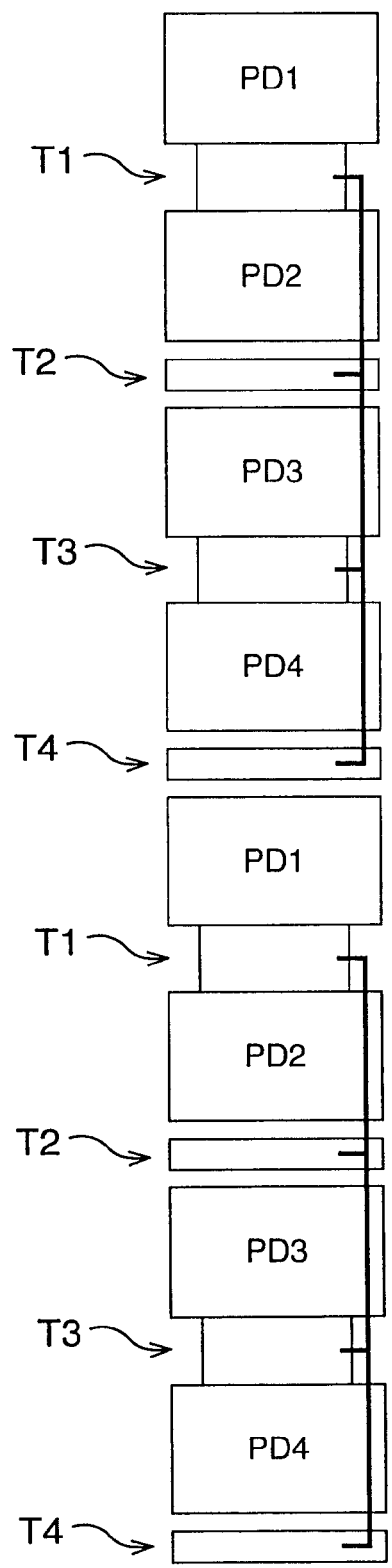
FIG. 3 is a schematic view illustrating two sensor units.
Figure 4:
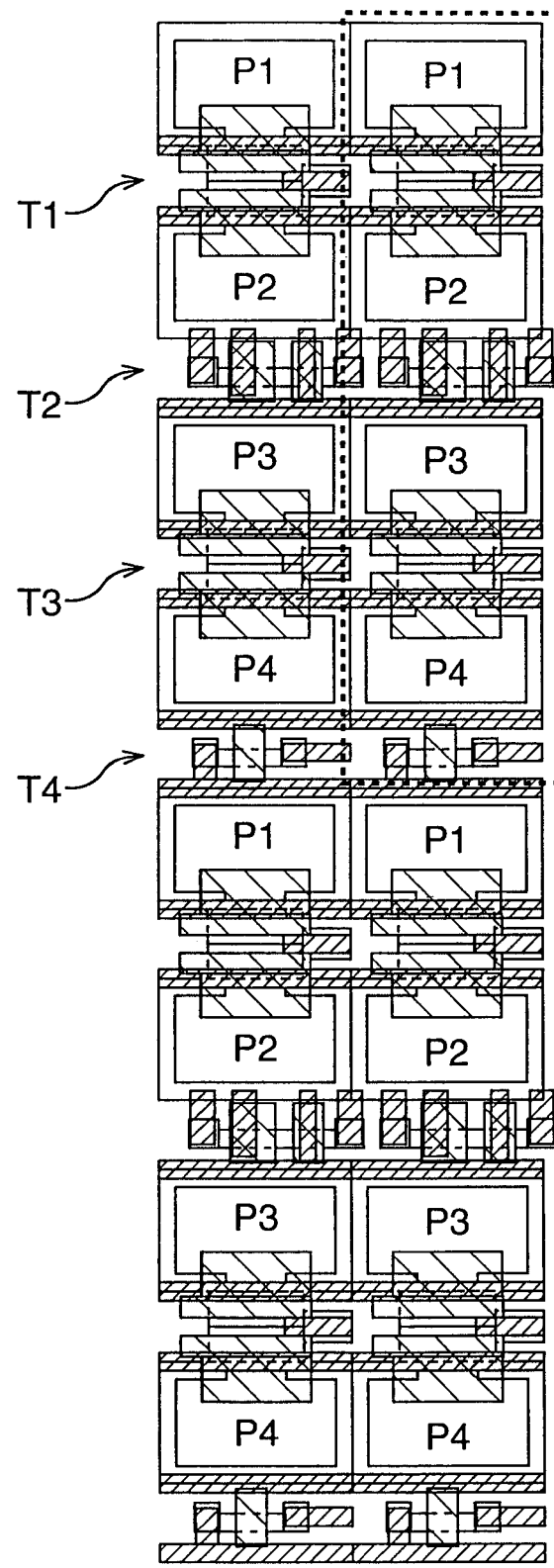
FIG. 4 is a schematic plan view illustrating, in detail, the arrangement of four sensor units.

FIG. 1 is a schematic view illustrating the basic structure of the CMOS image sensor (a sensor unit including four PDs aligned along the column direction: simply referred to as a sensor unit hereafter) according to the first embodiment. FIG. 2 is a schematic plan view illustrating, in detail, the arrangement of the sensor unit of FIG. 1. FIG. 3 is a schematic view illustrating two sensor units, and FIG. 4 is a schematic plan view illustrating, in detail, the arrangement of four sensor units (inside of the dashed line corresponds to a single sensor unit). Here, FIGS. 2 and 4, illustrate, as the basic structure of the sensor unit, how a first level wiring layer is formed on the gate electrode of respective transistors.

As shown in FIGS. 1 and 2, the basic structure of the sensor unit of the present embodiment is composed of photodiodes PD1 to PD4 disposed in alignment along the column direction, a transistor structure T1 disposed between PD1 and PD2, a transistor structure T2 disposed between PD2 and PD3, a transistor structure T3 disposed between PD3 and PD4, and a transistor structure T4 disposed adjacent to PD4 (between PD4 and PD1 of the sensor unit of the subsequent stage).

A shield diffused layer SD of these PDs is formed over PD1 to PD4.

The transistor structure T1 is composed of FD1, and TG-Tr1 and TG-Tr2. Here, the gate electrode of TG-Tr1 is indicated as TG-G1, and a TG line (connected to TG-G1 of TG-Tr1) being a part of a first level wiring layer is indicated as TG line 1. In addition, the gate electrode of TG-Tr2 is indicated as TG-G2, and the TG line (connected to TG-G2 of TG-Tr2) being a part of the first level wiring layer is indicated as TG line 2. TG-G1 and TG line 1 are connected by a plug P1. TG-G2 and TG line 2 are connected by a plug P2. FD1 is connected to wiring W1 which is a part of the first level wiring layer by a plug P5.

Similarly, the transistor structure T3 is composed of FD2, and TG-Tr3 and TG-Tr4. Here, the gate electrode of TG-Tr3 is indicated as TG-G3, and the TG line (connected to TG-G3 of TG-Tr3) which is a part of the first level wiring layer is indicated as TG line 3. In addition, the gate electrode of TG-Tr4 is indicated as TG-G4, and the TG line (connected to TG-G4 of TG-Tr4) which is a part of the first level wiring layer is indicated as TG line 4. TG-G3 and TG line 3 are connected by a plug P3. TG-G4 and TG line 4 are connected by a plug P4. FD2 is connected to wiring W2 which is a part of the first level wiring layer by a plug P6.

The transistor structure T2 is composed of SF-Tr and SL-Tr.

Here, the gate electrode and the drain electrode of SF-Tr are indicated as SF-G, and SF-D, respectively. SF-G is connected to wiring W3 which is a part of the first level wiring layer by a plug P7. SF-D is connected, by a plug P8, to a wiring W4 which is connected to Vr1 line (a part of the second level wiring layer) described below.

In addition, the gate electrode and the source electrode of SL-Tr are indicated as SL-G and SL-S, respectively. SL-G is connected to the SL line which is a part of the first level wiring layer by a plug P9. SL-S, being a part of the first level wiring layer, is connected, by a plug P10, to a wiring W5 which is connected to SG line (a part of the second level wiring layer) described below.

The transistor structure T4 is composed of RS-Tr.

Here, the gate electrode, the source electrode, and the drain electrode of RS-Tr are indicated as RS-G, RS-S, and RS-D, respectively. RS-G is connected to RS line which is a part of the first level wiring layer by a plug P11. RS-S is connected to a wiring W6 which is a part of the first level wiring layer by a plug P12. RS-D, being a part of the first level wiring layer, is connected, by a plug P13, to Vr2 line to which reset voltage Vr2 is applied.

In other words, the order of disposition in this sensor unit is PD1/FD1, TG-Tr1, 2/PD2/SF-Tr, and SL-Tr/PD3/FD2 and TG-Tr3, 4/PD4/RS-Tr.

As thus described, with the sensor unit in the CMOS image sensor of the present embodiment, SF-Tr, RS-Tr, and SL-Tr which compose the signal voltage reading unit are suitably distributed and disposed as two groups, namely, the transistor structure T2 (SF-Tr and SL-Tr) and the transistor structure T4 (RS-Tr), as well as transistor structures T1 and T3 are suitably disposed. In other words, respective PDs have transistor structures inserted at the upper and lower boundaries between their adjacent PDs. As a result, referring to, for example, the four sensor units disposed in alignment as shown in FIGS. 3 and 4, the transistor structure T4 is disposed between PD4 of one sensor unit and PD1 of the other sensor unit, whereby disposing eight PDs at intervals as even as possible, in the two sensor units aligned along the column direction. Therefore, in view of the entire pixel array with a plurality of PDs arranged in a matrix-like pattern, an arrangement is realized in which all of the PDs are disposed at intervals as even as possible.

According to this arrangement, respective transistors composing the signal voltage reading unit may be arranged in the following layout, when each pixel of the CMOS image sensor is laid out according to the 0.18 μm rule with a pitch of 2.25 μm. Here, L is the gate electrode length of the gate electrode of each transistor, and W is the gate width.

SF-Tr: L/W=0.50 μm/0.22 μm

SL-Tr: L/W=0.34 μm/0.22 μm

RS-Tr: L/W=0.34 μm/0.22 μm

As thus described, with the sensor unit in the CMOS image sensor of the present embodiment, a layout becomes possible such that the size of respective transistor structures can be made larger than the case (for example, the case in Patent Document 2) in which the transistor structures T1 to T4 composing the signal voltage reading unit are integrated in a single location, whereby reading of the signal charge with less variation among respective pixels is realized.

Additionally, in the present embodiment, since the shape of a typical pixel array is laterally long, respective PDs are formed into a laterally long shape with a vertical dimension of about 1.0 μm and a lateral dimension of about 1.8 μm, for example. By forming respective PDs into a laterally long shape in this manner, outstanding advantages arise as follows.

Figure 5A:
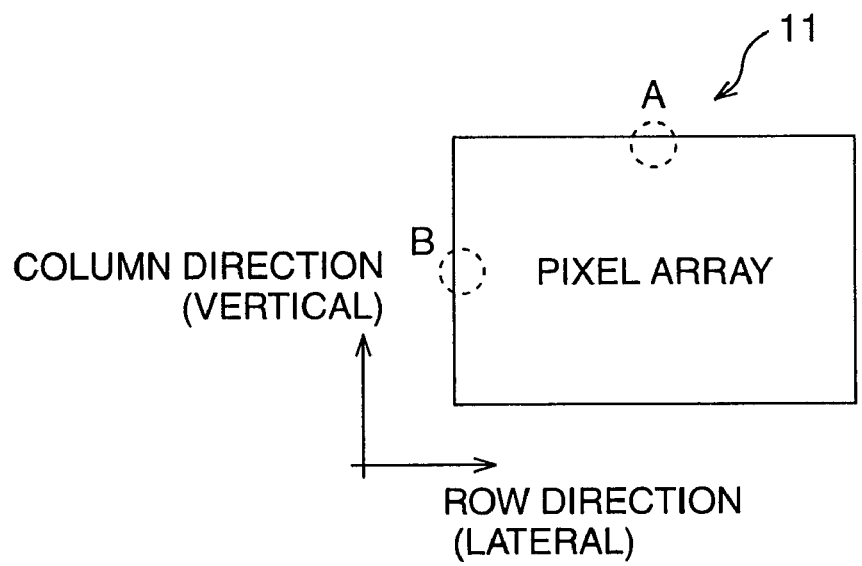
FIGS. 5A and 5B are schematic views illustrating the light receiving condition of the pixel array.
Figure 5B:
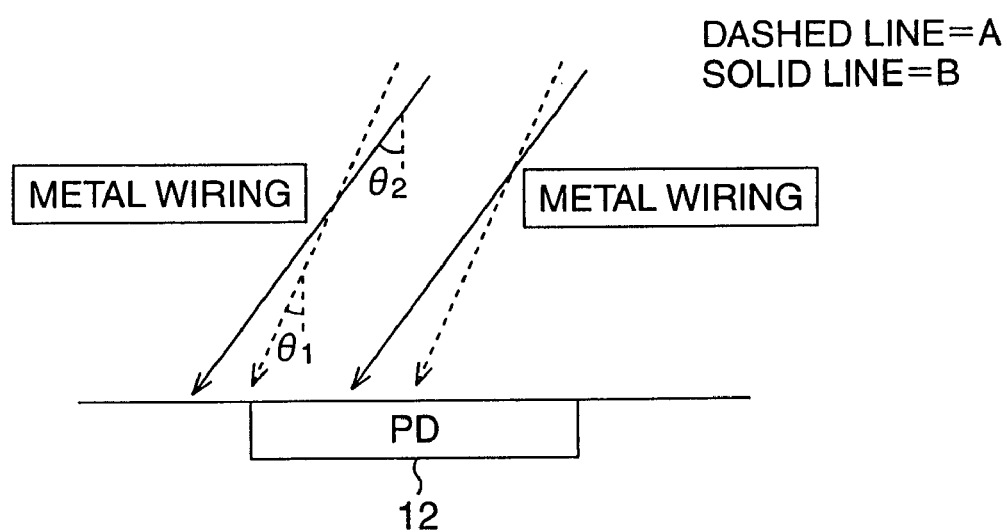

FIG. 5A illustrates a simplified plan view of a pixel array and FIG. 5B illustrates a cross-sectional view indicating the light receiving condition of the PD located at the end of the pixel array of FIG. 5A, respectively.

As shown in FIG. 5B, since the distance of PD12 (shown by a circle A in FIG. 5A) located at the vertical (column) end from the central part of the pixel array 11 is relatively close, the oblique incidence angle $\theta_1$ of the light (shown by dashed line) which passed through wiring 13 located at the upper layer is small, thus PD12 located at the vertical (column) end can sufficiently receive the light albeit its narrow width. On the other hand, since the distance of PD12 (shown by a circle B in FIG. 5A) located at the lateral (row) end from the central part of the pixel array 11 is relatively far, the oblique incidence angle $\theta_2$ of the light (shown by solid line) which passed through wiring 13 located at the upper layer is large, thus PD12 located at the lateral (row) end needs to have a wide width in order to realize sufficient light reception. In other words, it is desirable to form the PD to be laterally long in order to reduce shading.

With the present embodiment, the PDs can be disposed in a laterally long arrangement, since pixel-composing elements other than the PDs are disposed above and below the PD. Thus, sufficient light reception can be realized for all of the PDs composing the pixel array, whereby contributing to reduce shading.

A second level wiring layer of the sensor unit will be described next.

Figure 6:
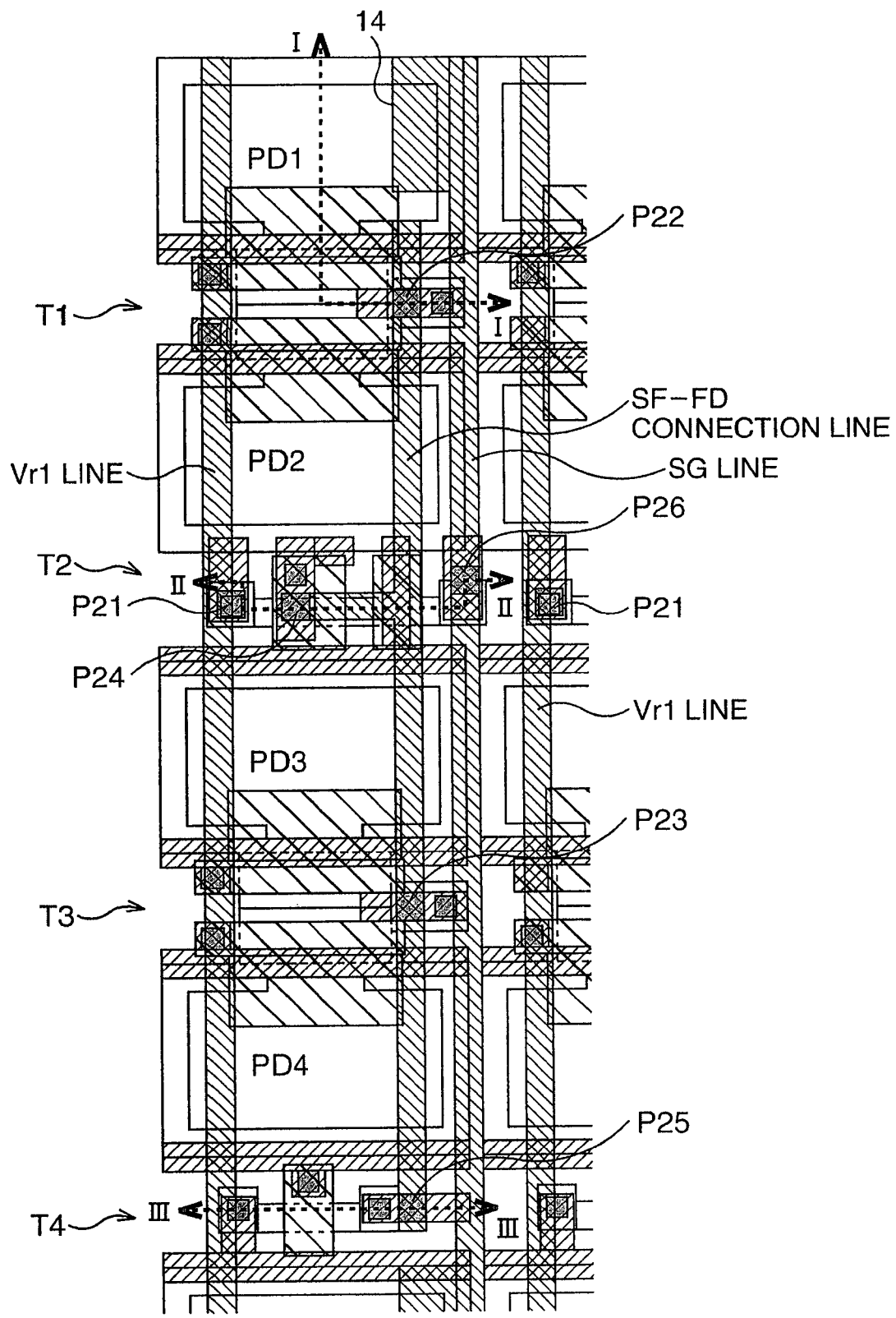
FIG. 6 is a schematic plan view illustrating how a second level wiring layer was formed on the sensor unit shown in FIG. 2.
Figure 7:
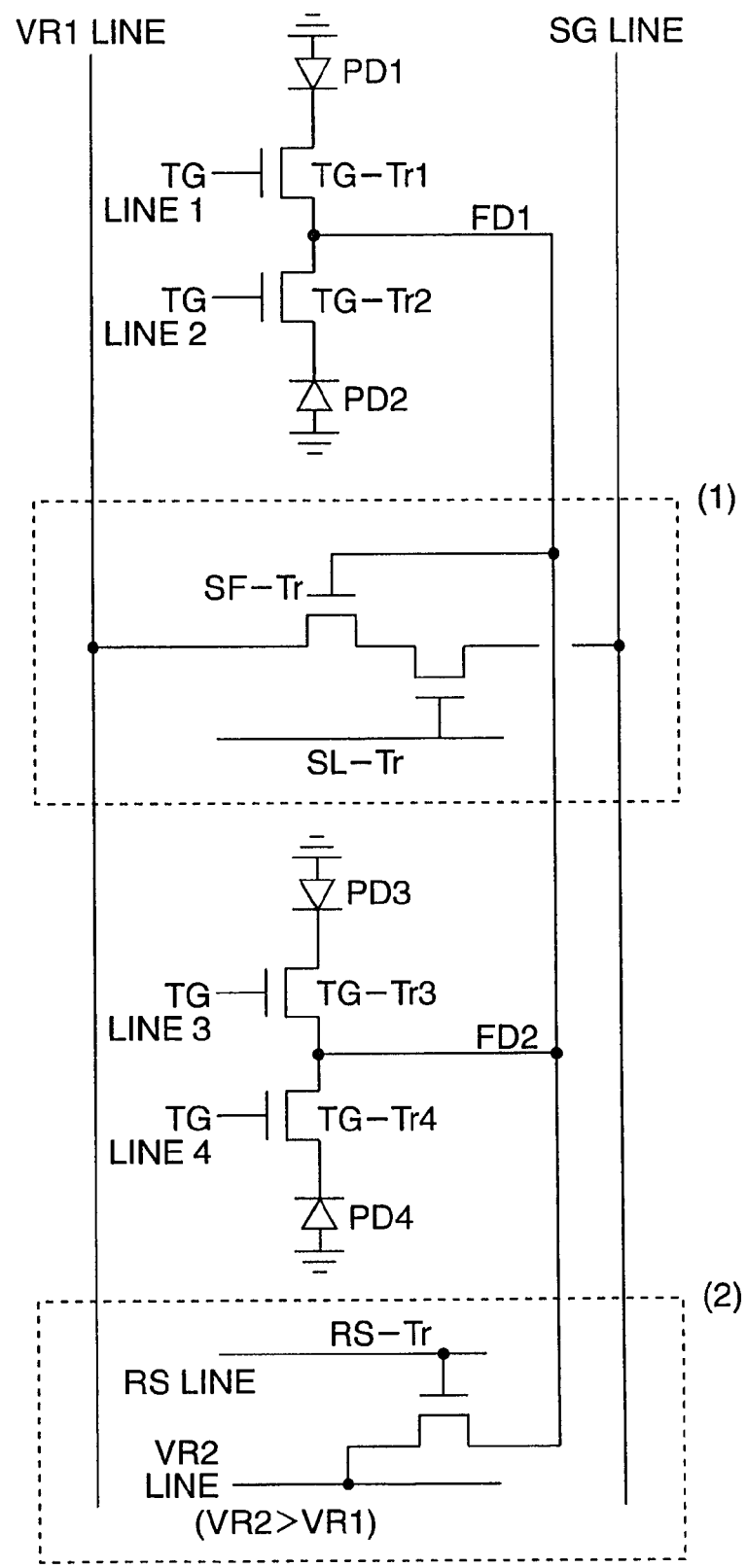
FIG. 7 is an equivalent circuit of the sensor unit of FIG. 6.
Figure 8:
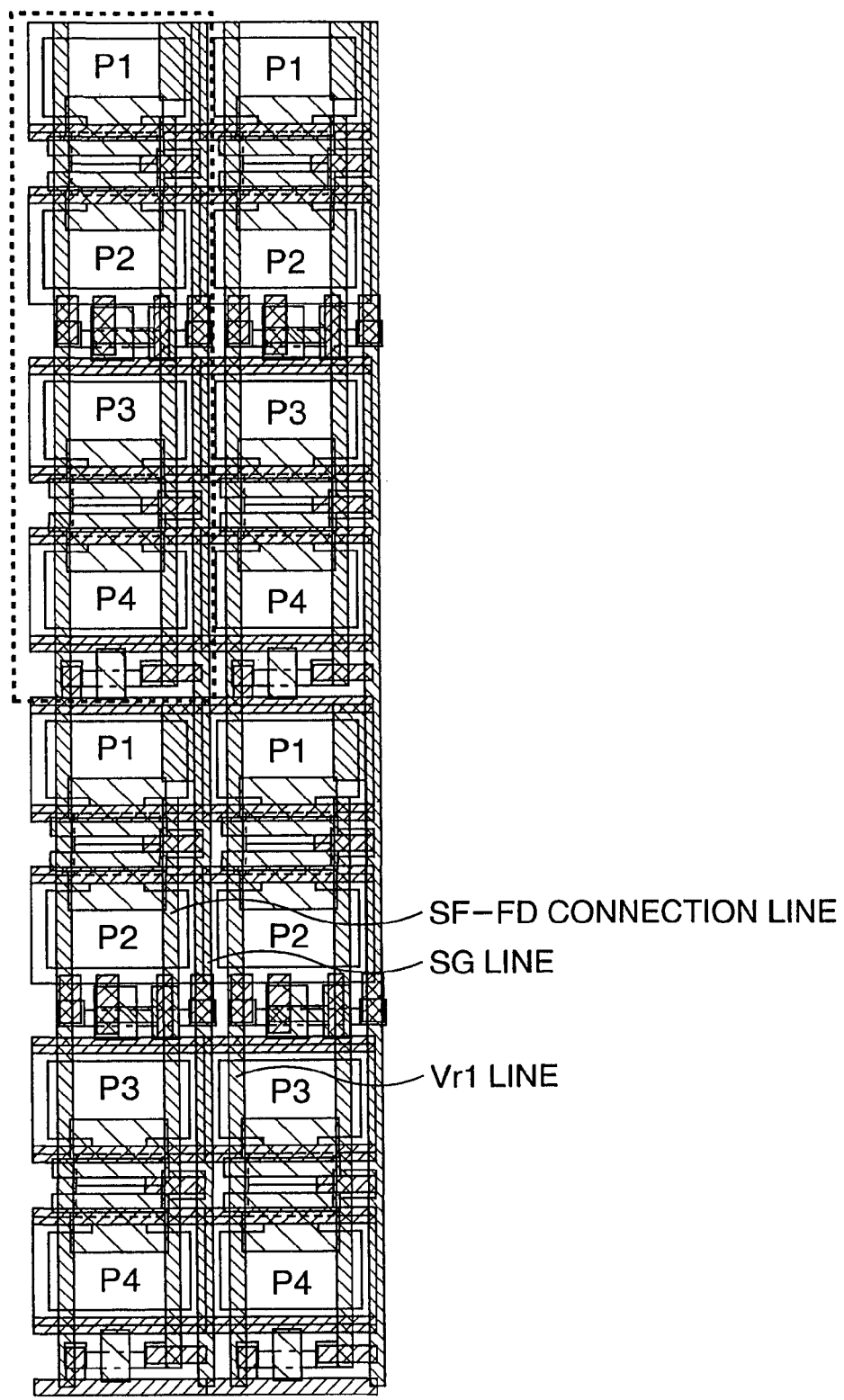
FIG. 8 is a schematic plan view illustrating how the second level wiring layer is formed on the four sensor units shown in FIG. 4.

FIG. 6 is a schematic plan view illustrating how the second level wiring layer is formed on the sensor unit shown in FIG. 2, and FIG. 7 illustrates an equivalent circuit of the sensor unit of FIG. 6. FIG. 8 is a schematic plan view illustrating how the second level wiring layer is formed on the four sensor units (inside of the dashed line corresponds to a single sensor unit) shown in FIG. 4.

The sensor unit of the present embodiment has, a Vr1 line to which reset voltage Vr1 is applied, an SF-FD connection line for connecting SF-Tr and FD1, 2, and an SG line for outputting the signal charge disposed therein as composing elements of the second level wiring layer.

The Vr1 line is connected to a wiring W4 by a plug P21. Accordingly, the Vr1 line is connected to SF-D of SF-Tr.

This Vr1 Line is formed along the column direction into a band-like shape with approximately the same width.

The SF-FD connection line is connected to: wiring W1 by a plug P22; wiring W2 by a plug P23; wiring W3 by a plug P24; and wiring W6 by a plug P25. As described above, wiring W1 is connected to FD1 by the plug P5, wiring W2 is connected to FD2 by the plug P6, wiring W3 is connected to SF-G by the plug P7, and wiring W6 is connected to RS-S by the plug P12. Accordingly, the SF-FD connection line is connected to SF-G of FD1, 2 and SF-Tr, and RS-S of RS-Tr.

The SF-FD connection line is partially overlapping as seen from the top view with PD2 to PD4, i.e. the adjacent elements among PD1 to PD4 composing the sensor unit, as well as with TG line 1 to TG line 4, whereas line SF-FD is not overlapping with PD1 as seen from the top view.

The SG line is connected to a wiring W5 by a plug P26. Accordingly, the SG line is connected to SL-S of SL-Tr.

The SG line has a protrusion 14 toward PD1 so as to be partially overlapping with PD1 as seen from the top view.

Figure 9:
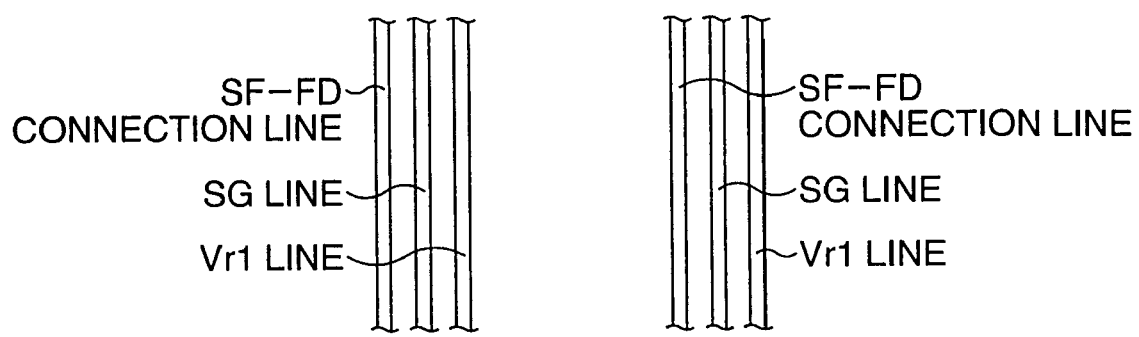
FIG. 9 is a schematic plan view illustrating the arrangement of the second level wiring layer in a simplified form.
Figure 10A:
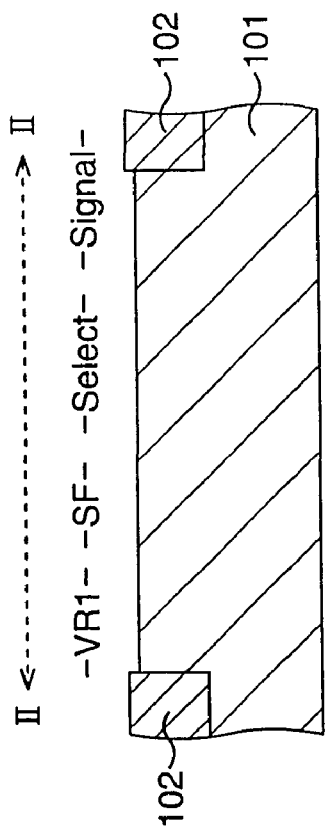
FIGS. 10A to 10D are schematic cross-sectional views illustrating the manufacturing method of the CMOS image sensor according to the present embodiment, in the order of processing.
Figure 10B:
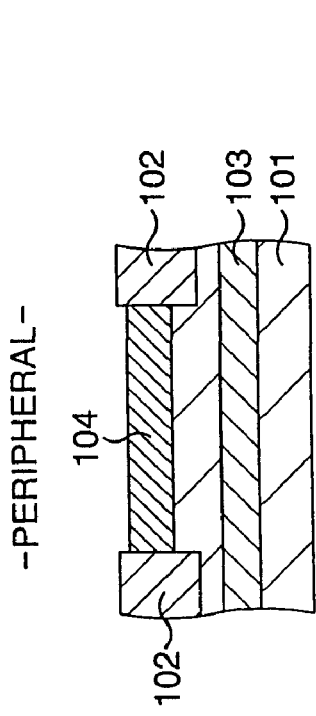
Figure 10C:
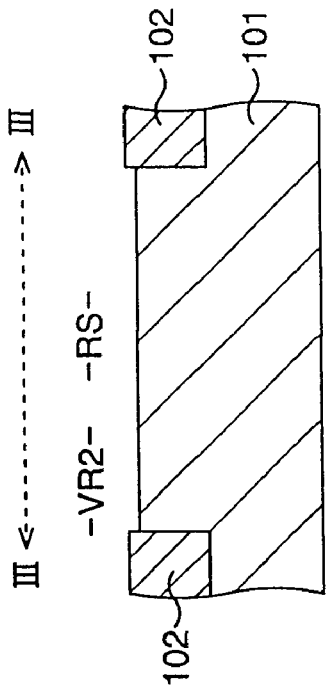
Figure 10D:
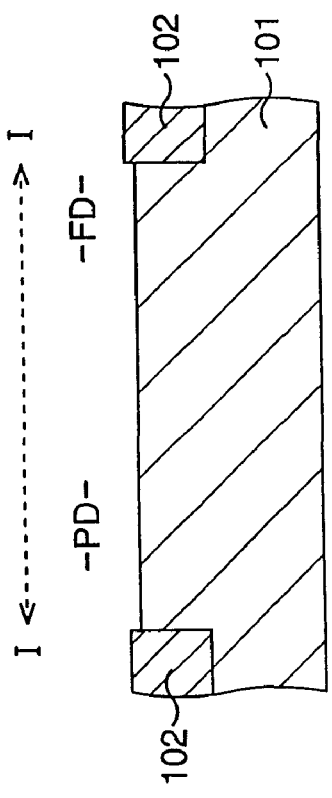
Figure 11A:
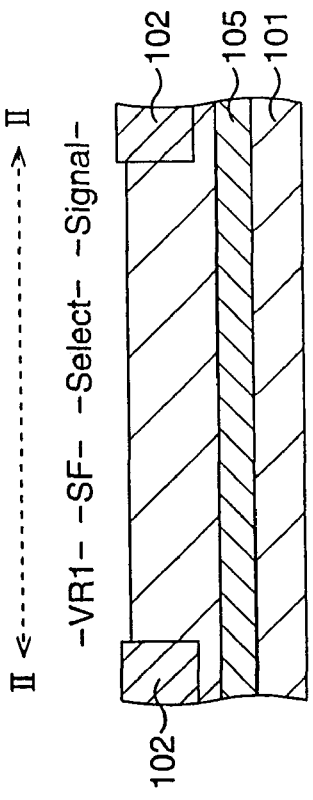
FIGS. 11A to 11D are schematic cross-sectional views illustrating, subsequent to FIG. 10A to 10D, the manufacturing method of the CMOS image sensor according to the present embodiment in the order of processing.
Figure 11B:
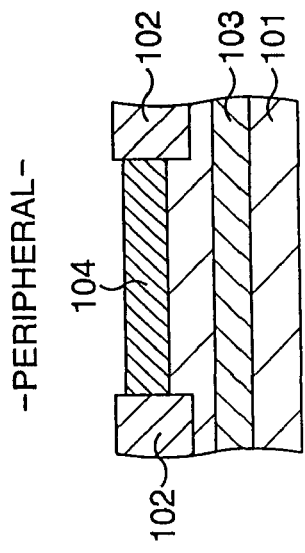
Figure 11C:
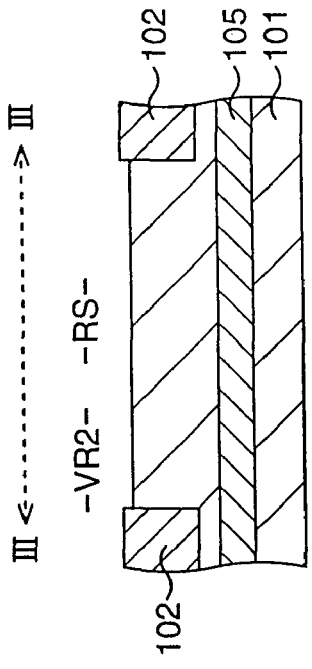
Figure 11D:
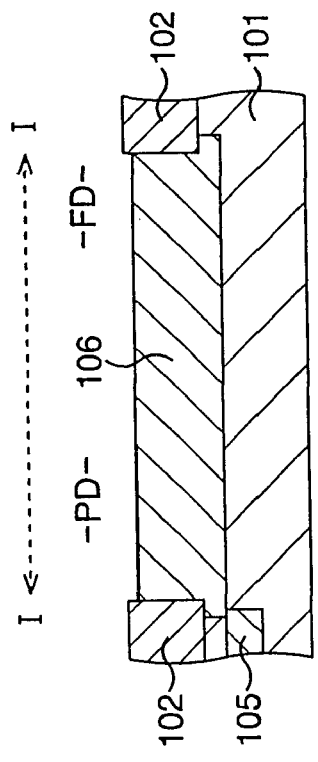

In the present embodiment, as shown in FIGS. 6 and 9, the Vr1 line, the SF-FD connection line and the SG line are each extending in alignment, in this order, along the column direction in the sensor unit, with the clearance between the Vr1 line and the SF-FD connection line being larger than the clearance between the SF-FD connection line and the SG line. In other words, the SF-FD connection line, the SG line, and the Vr1 line are disposed in this order, with the closest proximity, between two sensor units which are adjacent along the row direction.

Now, if the SF-FD connection line and the Vr1 line come into closest proximity, capacity of the SF-FD connection line connecting SF-Tr and FDs 1, 2 increases, resulting in a decreased pixel sensitivity. Therefore, as in the present embodiment, an SG line is disposed between the SF-FD connection line and the Vr1 line, between two sensor units which are adjacent along the row direction. On the SG line, since voltage varies along the same direction as that of the SF-FD connection line when reading the signal charge, there is little effect on the capacitance between the SF-Tr and the FDs 1,2. Particularly, providing each wiring in the above order is very effective for increasing pixel sensitivity, in the case of a structure having a long distance from the top-most FD1 to RS-S of the bottom-most RS-Tr, such as the sensor unit in the present embodiment.

In addition, as stated above, the present embodiment employs an arrangement such that reset voltage Vr1 is applied to the SF-D electrode and reset voltage Vr2 is applied to RS-D, separately. FIG. 7 illustrates the arrangement clearly. Here, dashed line (1) shows how the Vr1 line of reset voltage Vr1 is connected to SF-D, and dashed line (2) shows how the Vr2 line of reset voltage Vr2 is connected to RS-D, respectively. By this arrangement, different voltages can be applied on Vr1 and Vr2. For example, by setting Vr1<Vr2, the effect of characteristic variation (due to short channel effect) of SF-Tr can be suppressed since Vr1 of SF-D is low. At the same time, favorable transfer efficiency can be achieved when transferring the signal charge, since Vr2 which is higher than Vr1 is applied to FDs 1, 2.

Furthermore, a correct source-follower operation of SF-Tr at the read timing can be realized even if the differential value (Vr2−Vr1) between Vr2 and Vr1 is increased, provided that the threshold voltage ($V_{th}$) of SF-Tr is set to be sufficiently higher than that of RST-Tr by setting the gate electrode length of SF-Tr longer than RST-Tr, similarly with the present embodiment, or setting the channel impurity concentration of SF-Tr higher than that of RST-Tr.

Manufacturing Method of a CMOS Image Sensor

A Manufacturing method of a CMOS image sensor according to the present embodiment will be described below. In the present embodiment, description will be directed to a sensor unit including an NMOS transistor in the peripheral circuitry.

Figure 12A:
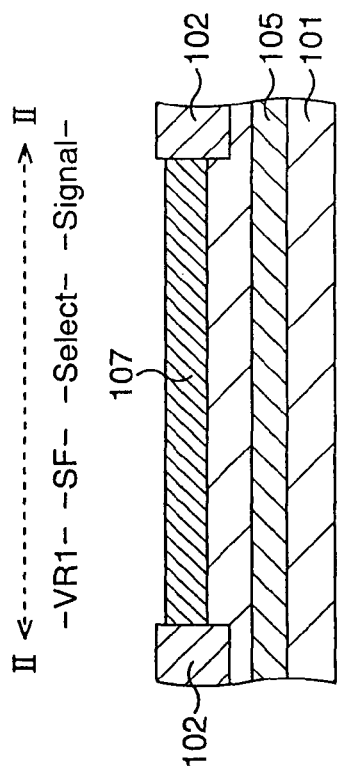
FIGS. 12A to 12D are schematic cross-sectional views illustrating, subsequent to FIGS. 11A to 11D, the manufacturing method of the CMOS image sensor according to the present embodiment in the order of processing.
Figure 12B:
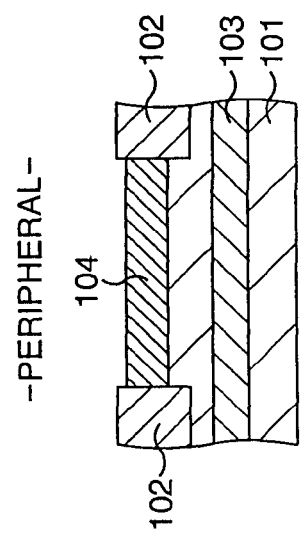
Figure 12C:
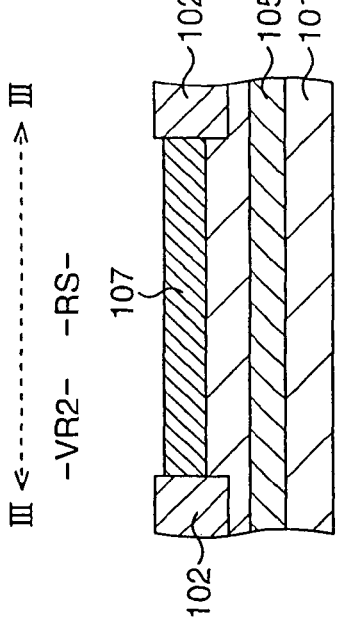
Figure 12D:
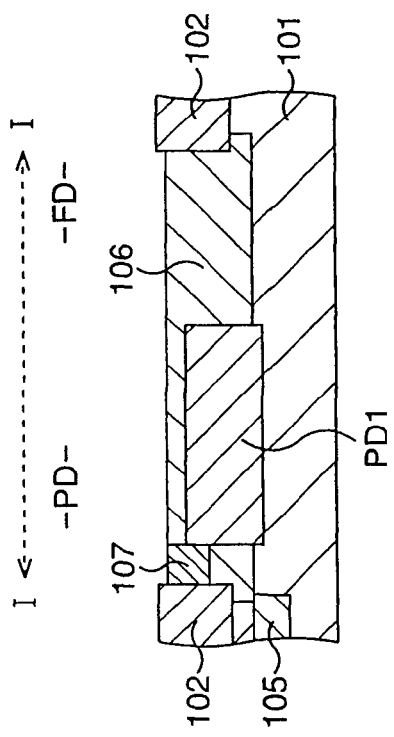
Figure 13A:
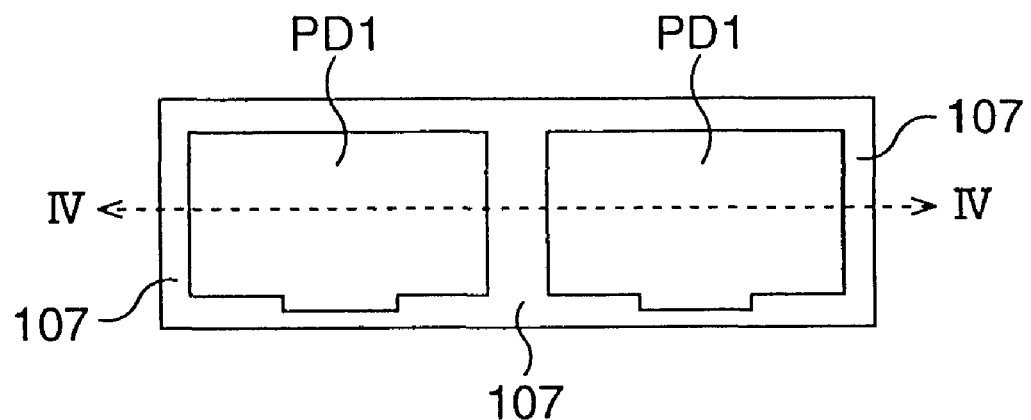
FIGS. 13A and 13B are schematic cross-sectional views illustrating, subsequent to FIGS. 11A to 11D, the manufacturing method of the CMOS image sensor according to the present embodiment in the order of processing.
Figure 13B:
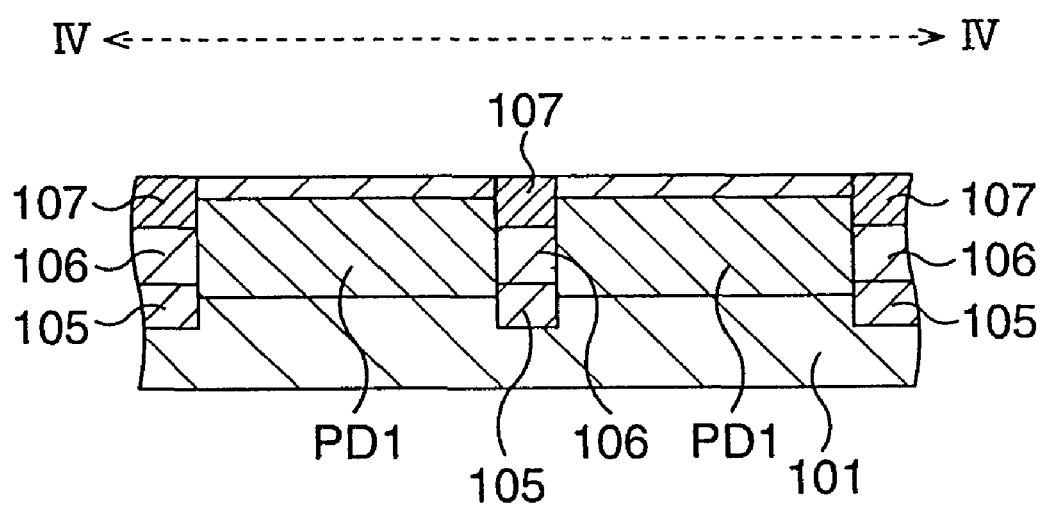
Figure 14A:
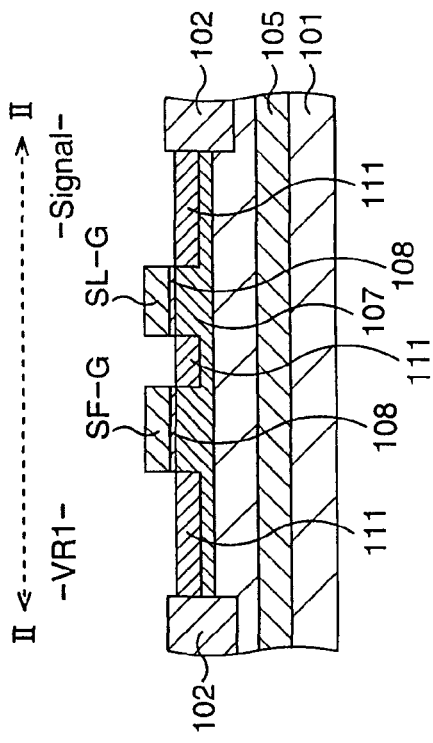
FIGS. 14A to 14D are schematic cross-sectional views illustrating, subsequent to FIGS. 12A to 12D and FIGS. 13A and 13B, the manufacturing method of the CMOS image sensor according to the present embodiment in the order of processing.
Figure 14C:
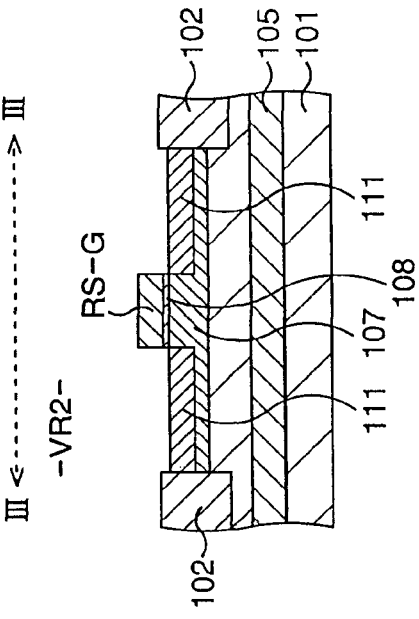
Figure 14B:
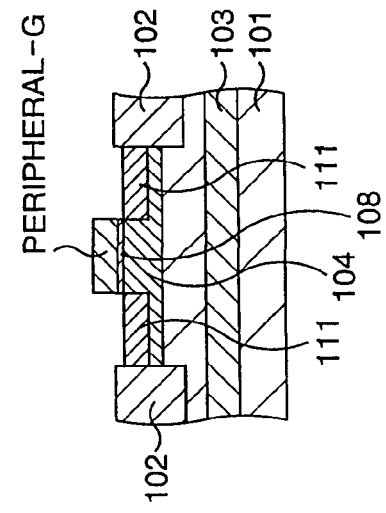
Figure 14D:
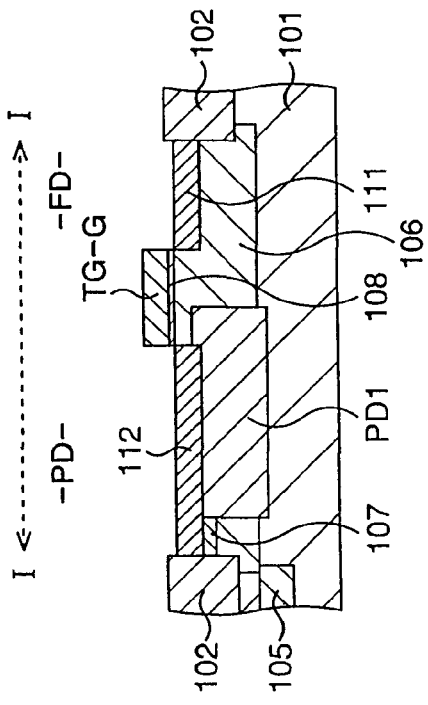

FIGS. 10A-10D to FIGS. 12A-12D and FIGS. 14A-14D to 19 are schematic cross-sectional views illustrating, in the order of processing, the manufacturing method of the CMOS image sensor according to the present embodiment, and FIGS. 13A and 13B are schematic views illustrating one process of the CMOS image sensor (A is a schematic plan view illustrating PDs which are adjacent along the row direction, and B is a schematic cross-sectional view taken along the dashed line IV-IV in A).

Figure 17A:
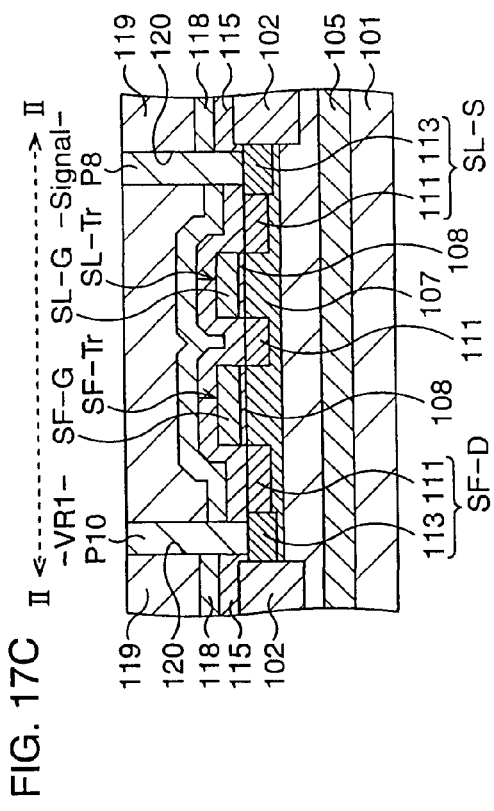
FIGS. 17A to 17D are schematic cross-sectional views illustrating, subsequent to FIGS. 16A to 16D, the manufacturing method of the CMOS image sensor according to the present embodiment in the order of processing.
Figure 17B:
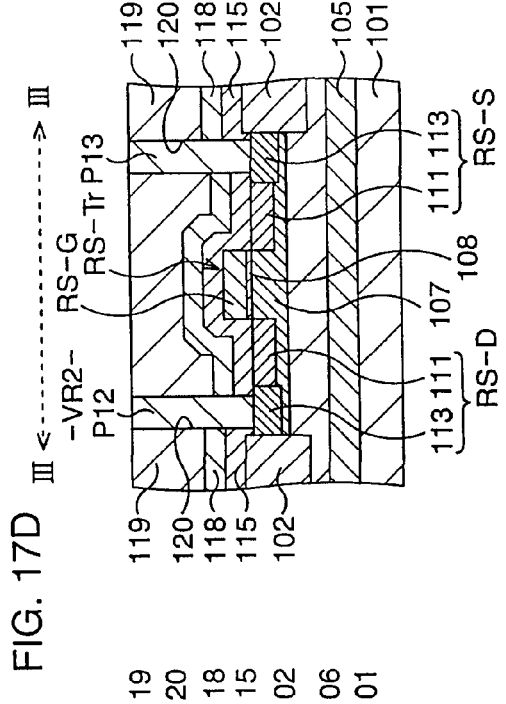
Figure 17C:
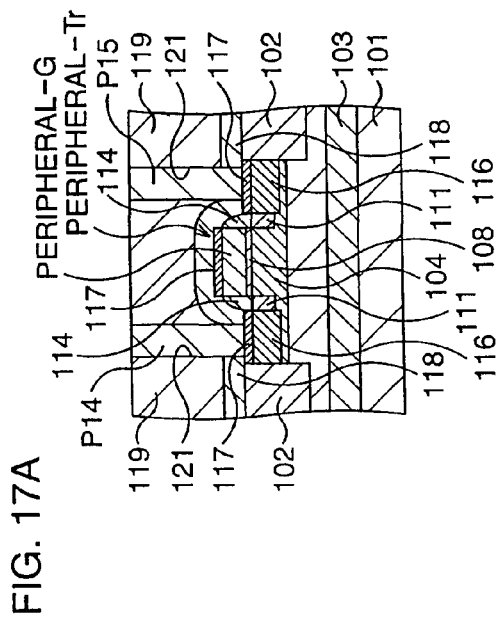
Figure 17D:
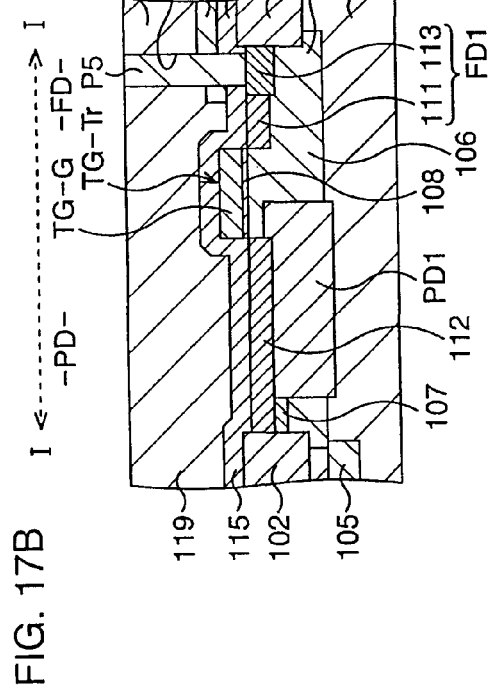
Figure 18A:
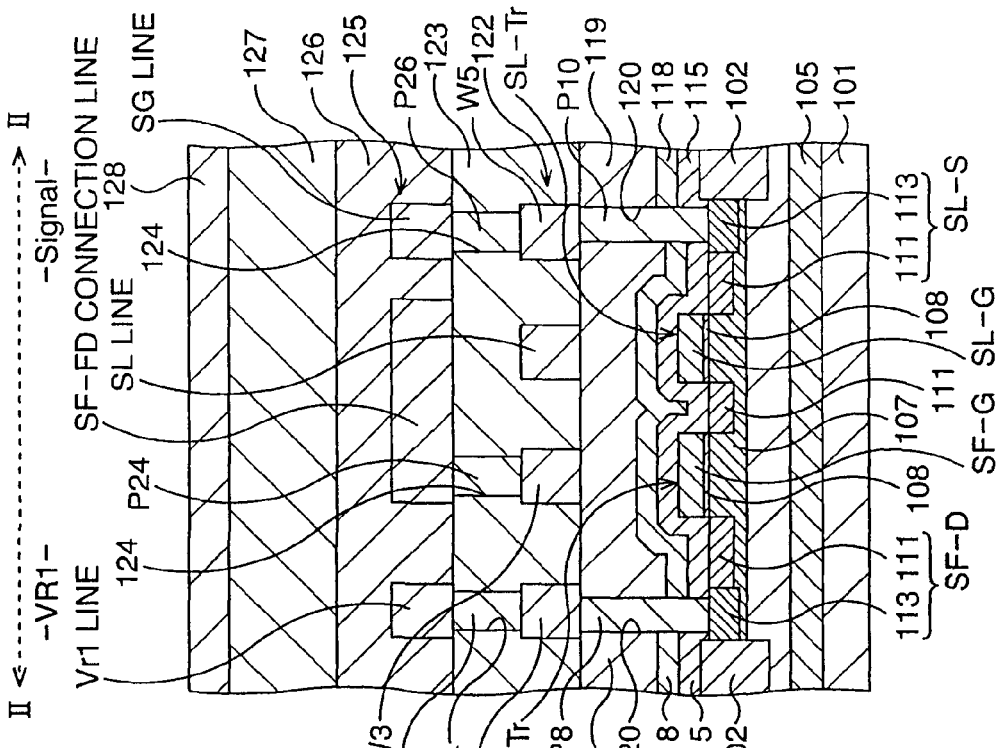
FIGS. 18A and 18B are schematic cross-sectional views illustrating, subsequent to FIGS. 17A to 17D, the manufacturing method of the CMOS image sensor according to the present embodiment in the order of processing.
Figure 18B:
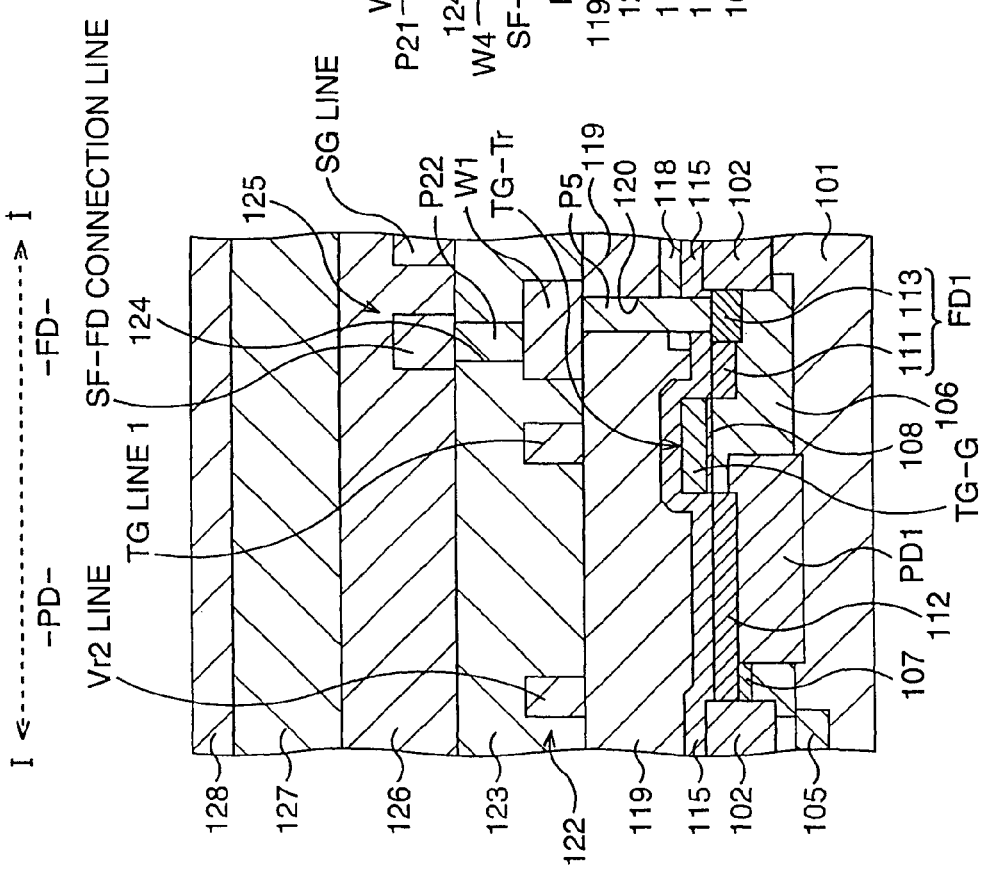
Figure 19:
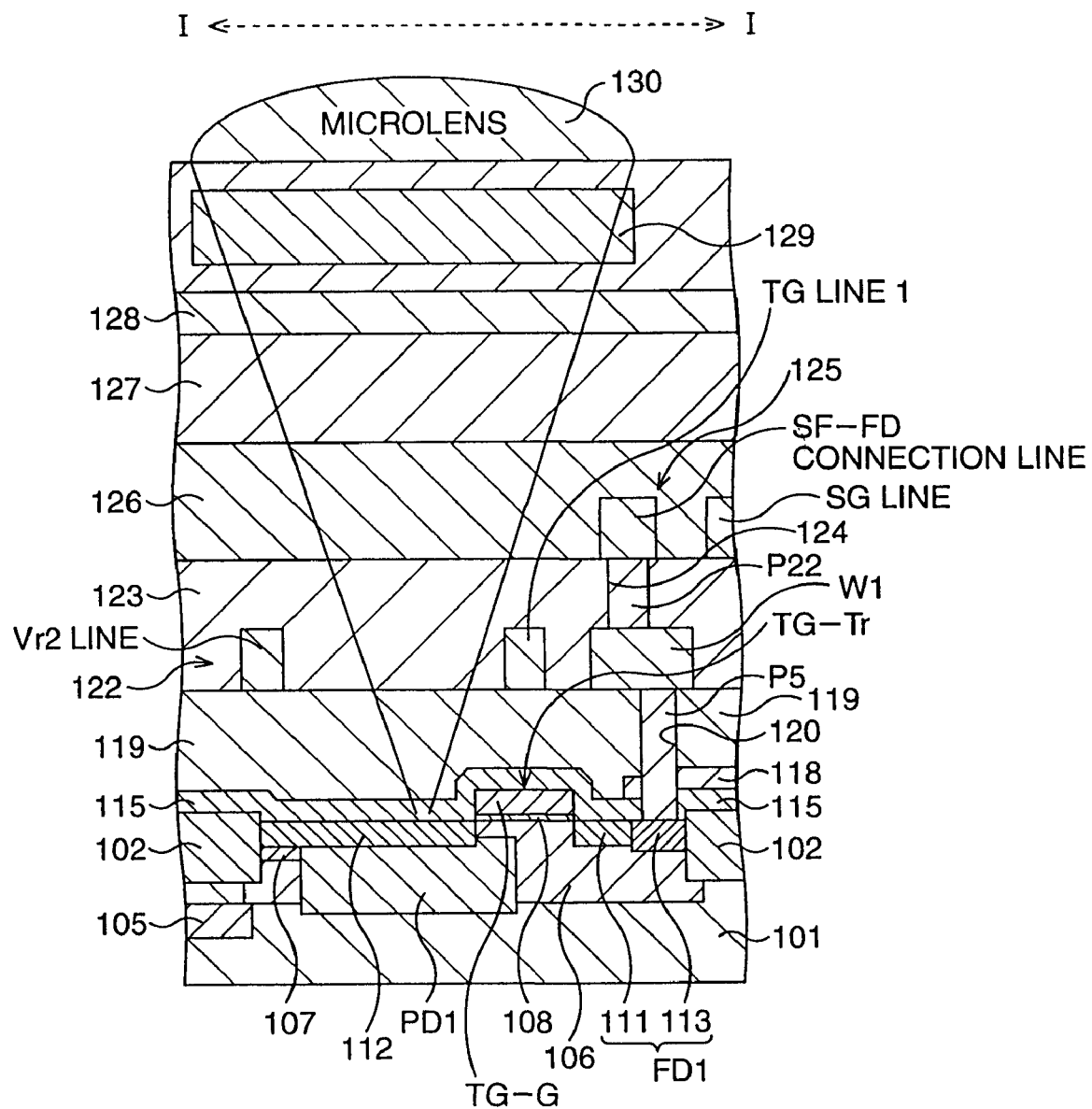
FIG. 19 is a schematic cross-sectional view illustrating, subsequent to FIGS. 18A and 18B, the manufacturing method of the CMOS image sensor according to the present embodiment in the order of processing.

Here, in respective diagrams of FIGS. 10A-10D to FIGS. 12A-12D and FIGS. 14A-14D to FIGS. 17A-17D, A shows a cross section of a NMOS transistor in the peripheral circuitry, B shows a cross section taken along the dashed line I-I of FIG. 2, C shows a cross section taken along the dashed line II-II of FIG. 2, and D shows a cross section taken along the dashed line III-III of FIG. 2, respectively. In FIGS. 18A and 18B, A corresponds to a cross section taken along the dashed line I-I of FIG. 2 and B corresponds to a cross section taken along the dashed line II-II of FIG. 2. FIG. 19 corresponds to a cross section taken along the dashed line I-I of FIG. 2.

Additionally, in respective diagrams of FIGS. 10A-10D to FIG. 19, "-Peripheral-" indicates the formation region of the NMOS transistor in the peripheral circuitry (denoted as peripheral-Tr, hereafter), "-PD-" indicates the formation region of respective PDs, "-Vr1-, -Vr2-" indicate the formation regions of Vr1 line and Vr2 line, "-FD-" indicates the formation region of FD1 (the same for FD2), "-SF-" indicates the formation region of SF-Tr, "-Select-" indicates the formation region of SL-Tr, "-Signal-" indicates the formation region of SG line, and "-RS-" indicates the formation region of RS-Tr, respectively.

FIGS. 10A to 10D:

First, an STI element separation structure 102 which defines an element region is formed.

Specifically, an element isolation region of the silicon substrate 101 is etched to a depth of about 400 nm, for example, to form a separation channel. Then, an insulator, namely silicon oxide (HDP-SIO) here, is deposited so as to bury the separation channel, and the surface is polished by the chemical mechanical polishing (CMP) method to form an STI element separation structure 102 having the separation channel filled with silicon oxide.

Next, P-type wells 103 and 104 are formed on the formation region of the peripheral-Tr.

Specifically, a resist mask (not shown) is formed to provide an aperture in the formation region of the peripheral-Tr, into which a P-type impurity, namely boron ($B^+$) here, is ion-injected under a condition with an acceleration energy of 300 keV, a dose amount of $3*10^{13}/cm^2$, and an injection angle (angle of inclination from the normal against the surface of the substrate) of 0° to form a P-type well 103. The P-type well 103 needs to be formed with high concentration in order to reduce the substrate resistance.

Subsequently, a P-type impurity, namely boron ($B^+$) here, is ion-injected under a condition with an acceleration energy of 30 keV, a dose amount of $5*10^{12}/cm^2$, and an injection angle of 7° to form a P-type well 104. The resist mask is removed by ashing or the like.

FIGS. 11A to 11D:

Then, P-type wells 105 and 106 are formed.

Specifically, a resist mask (not shown) is first formed to provide an aperture in respective formation regions shown in C and D, into which a P-type impurity, namely boron ($B^+$) here, is ion-injected under a condition with an acceleration energy of 300 keV, a dose amount of $1*10^{13}/cm^2$, and an injection angle of 0° to form a P-type well 105. The resist mask is removed by ashing or the like.

Next, a resist mask (not shown) is formed to provide an aperture in respective formation regions show in B, into which a P-type impurity, namely boron ($B^+$) here, is ion-injected under a condition with an acceleration energy of 144 keV, a dose amount of $2*10^{12}/cm^2$, and an injection angle of 7° to form a P-type well 106. The resist mask is removed by ashing or the like.

FIGS. 12A-12D to FIGS. 13A-13B:

Subsequently, a P-type well 107 and PD1 to PD4 (PD1 in the illustrated example) are formed.

Specifically, a resist mask (not shown) is formed to provide an aperture in respective formation regions shown in C and D, between the PD formation region and the STI element separation structure 102 shown in B with regard to FIGS. 12A-12D, and between the PDs which are adjacent along the row direction in B with regard to FIGS. 13A-13B. Then a P-type impurity, namely boron ($B^+$) here, is ion-injected under a condition with an acceleration energy of 30 keV, a dose amount of $5*10^{12}/cm^2$, and an injection angle of 7° to form a P-type well 107. The P-type well 107 contributes to controlling the threshold value of each transistor composing the signal voltage reading unit. The resist mask is removed by ashing or the like.

Here, the ion injection for forming the P-type well 107 is performed using approximately the same dose mount as when forming the P-type well 104. However, since transistors having a channel width narrower than that of the NMOS transistor of the peripheral circuitry are used for respective transistors of the signal charge reading unit, the transistor characteristic (Vt) can be adjusted independent of the peripheral-Tr by using a different dose amount of ion injection for forming the P-type well 107 from that for the peripheral-Tr. For example, when element separation is performed by the STI method, the dose amount for the P-type well 107 may be increased by about $1*10^{12}/cm2$ compared to that for the peripheral-Tr, since the transistor characteristic (Vt) tends to fall if the channel width is narrow. In addition, the P-type well 107 may also be formed in the part between respective PDs and the STI element separation structure 102 to raise the P-type impurity density of this part, whereby strengthening the separation between respective PDs and the STI element separation structure 102.

Next, a resist mask (not shown) is formed to provide an aperture in the formation regions of PDs shown in FIGS. 12B and 13B, then three types of ion injection is performed as follows. First, an N-type impurity, namely phosphor ($P^+$) here, is ion-injected under a condition with an acceleration energy of 325 keV, a dose amount of $1*10^{12}/cm^2 \sim 3*10^2/cm^2$, and an injection angle of 7°. Next, phosphorus ($P^+$) is ion-injected under a condition with an acceleration energy of 207 keV, a dose amount of $1*10^{12}/cm^2$ to $3*10^{12}/cm^2$, and an injection angle of 7°. Then, phosphorus ($P^+$) is ion-injected under a condition with an acceleration energy of 135 keV, a dose amount of $1*10^{12}/cm^2$ to $3*10^{12}/cm^2$, and an injection angle of 7°. PD1 to PD4 (PD1 in the illustrated example) are formed through these ion injections. The resist mask is removed by ashing or the like.

FIGS. 14A to 14D:

Subsequently, respective LDD regions 111 of peripheral-Tr, TG-Tr, SF-Tr, SL-Tr and RS-Tr, and $P^+$ shield region 112 of respective PDs are formed.

Specifically, the substrate surfaces of respective formation regions shown in A, B, C, and D are first treated by thermal oxidation at 800° C., for example, to form a gate insulator 108 with a film thickness of about 8 nm.

Next, a polycrystalline silicon film (not shown) having a film thickness of about 180 nm is deposited over the entire substrate surface including respective formation regions shown in A, B, C, and D, by the CVD method, for example.

Next, on an entire surface of a polycrystalline silicon film, N-type impurity, namely phosphor ($P^+$) here, is ion-injected under a condition with an acceleration energy of 20 keV, a dose amount of $4*10^{15}/cm^2$, and an injection angle of 7° followed by an annealing process for about 60 minutes, then rendering the polycrystalline silicon film to be of $N^+$ type.

Then a polycrystalline silicon film is patterned by lithography and dry etching. This results in pattern formation of: peripheral-G which is the gate electrode of peripheral-Tr in the formation region of peripheral-Tr in A; gate electrode TG-G in the formation region of TG-tr in B; gate electrodes SF-G and SL-G in the formation region of SF-Tr and the formation region of SL-Tr in C; and RS-G in the formation region of RS-Tr in D. The resist mask used for the patterning is removed by ashing or the like.

Next, a resist mask is formed to cover the formation regions of respective PDs and to provide an aperture in respective formation regions in A, B, C, and D. Then, an N-type impurity, namely phosphorus (P⁺) here, is ion-injected under a condition with an acceleration energy of 20 keV, a dose amount of $4*10^{13}/cm^2$, and an injection angle of 0° into both sides of each gate electrode in respective formation regions shown in A, B, C, and D to form a LDD region 111 on both sides of the gate electrode in each region. The resist mask is removed by ashing or the like.

Next, a resist mask is formed to provide an aperture in the formation regions of respective PDs, and a P-type impurity, namely boron (B⁺) here, is ion-injected under a conditions such as an acceleration energy of 10 keV, a dose amount of $1*10^{13}/cm^2$ to $3*10^{13}/cm^2$, and an injection angle of 7° to form a P⁺ shield region 112 on the surface layers of respective PDs. This P⁺ shield region 112 renders respective PDs to be a buried structure.

FIGS. 15A to 15D:

Subsequently, respective connection regions 113 of the peripheral-Tr, TG-Tr, SF-Tr, SL-Tr and RS-Tr, a side wall insulator film 114, and an HTO film 115 are formed.

Specifically, a resist mask (not shown) is first formed to provide an aperture at the end of the STI element separation structure 102 of the LDD region 111, respectively in the formation region of FD1 (including FD2) in B, and respective formation regions in C and D. Using this resist mask, an N-type impurity, namely phosphorus (P⁺) here, is ion-injected under a condition with an acceleration energy of 15 keV, and a dose amount of $2*10^{15}/cm^2$ to form respective connection regions 113. Here, TG-Tr in the formation region in B, SF-Tr and SL-Tr in the formation region in C, and RS-Tr in the formation region in D are completed, respectively. The resist mask is removed by ashing or the like.

Next, a silicone oxide film, namely an HTO film 115 having a film thickness of about 100 nm is deposited over the entire substrate surface at a process temperature of about 750° C.

Then a resist mask is formed to provide an aperture in the formation region in A and, using this resist mask, anisotropy dry etching (etchback) is performed over the entire surface of the formation region in A to form a side wall insulator film 114, leaving the HTO film 115 only on both sides of the peripheral-G in the formation region in A. Here, the reason for keeping respective formation regions in B, C, and D covered with the HTO film 115 is to protect these formation regions from being silicided in the silicide process described below. The resist mask is removed by ashing or the like.

FIGS. 16A to 16D:

Subsequently, the peripheral-Tr is formed to be a silicide structure.

Specifically, a resist mask is formed to provide an aperture in the formation region in A and, using this resist mask, an N-type impurity, namely phosphorus (P⁺) here, is ion-injected under a condition with an acceleration energy of 13 keV, a dose amount of $2*10^{15}/cm^2$, and an injection angle of 7° into both sides of peripheral-G in respective formation regions in A to form a pair of SD regions 116. Here, a peripheral-Tr is completed in the formation region in A. The resist mask is removed by ashing or the like.

Next, after the silicon surface in the formation region in A is treated with hydrofluoric acid (HF), a Co film (not shown) is deposited by sputtering, and treated by rapid thermal annealing (RTA) at a temperature of about 520° C., for example. By the RTA treatment, Silicon and Co reacts to form a CoSi film 117 on the peripheral-G and the SD region 116. Subsequently, unreacted Co is removed by wet etching, which is treated by rapid thermal annealing (RTA) at a temperature of about 840° C., for example. Here, silicidation does not occur, since respective formation regions in B, C and D is kept being covered with the HTO film 115.

FIGS. 17A to 17D:

Subsequently, respective plugs P0, P1 to P13 (here, only plug P5, P8, P10, P12, P13 are shown) for connecting the first level wiring layer and are formed.

Specifically, a silicone oxide film (e.g. plasma SiO) and a silicon nitride film (e.g. plasma SiN) are first laminated with a film thickness of about 20 nm and about 70 nm over the entire surface to form an insulator film 118.

Next, a resist mask (not shown) is formed to provide an aperture in PD1 and TG-Tr in B (except for a part of FD1), and at least the silicon nitride film of the interlayer insulator film 118 is removed by lithography and dry etching. For convenience of illustration, FIG. 17B shows a state with the insulator film 118 of the aperture of the resist mask completely removed.

Next, silicone oxide film, namely plasma TEOS film here, is deposited with a film thickness of about 1000 nm over the entire surface to form an interlayer insulator film 119. Subsequently, the surface of the interlayer insulator film 119 is polished by the CMP method to flatten the surface of the interlayer insulator film 119.

Next, a resist mask (not shown) is formed to partially expose the surface of the interlayer insulator films 119 aligned with the connection region 113 of FD1 in B, the connection region 113 of SF-D and the connection region 113 of SL-S in C, and respective connection regions 113 of RS-D and RS-S in D. Using this resist mask, the interlayer insulator film 119, the insulator film 118, and the HTO film 115 are patterned to form respective contact holes 120 which expose a part of the connection region 113 of FD1 in B, the connection region 113 of SF-D and the connection region 113 of SL-S in C, and respective connection regions 113 of RS-D and RS-S in D. The resist mask is removed by ashing or the like.

Next, a resist mask (not shown) is formed to provide an aperture partially in the surface of the interlayer insulator films 119 aligned with a pair of SD regions 116 in A, respectively. Using this resist mask, the interlayer insulator film 119 and the insulator film 118 are patterned to form respective contact holes 121 which expose a part of the pair of SD regions 116 in A. The resist mask is removed by ashing or the like.

Next, an adherence film (not shown), namely Ti/TiN here, is formed by sputtering with a film thickness of about 30 nm/about 50 nm over the entire surface so as to cover the internal wall surface of respective contact holes 120 and 121. Subsequently, tungsten (W) is deposited by the CVD method over the entire surface via the adherence film so as to bury respective contact holes 120 and 121.

Then, the deposited W is polished by the CMP method with the surface of the interlayer insulator film 119 used as the polishing stopper. This polishing forms, a W plug P5 in the contact hole 120 in B, W plugs P8 and P10 in the contact hole 120 in C, W plugs P12 and 13 in the contact hole 120 in D, and W plugs P14 and P15 in the contact hole 121 in A, respectively. Here, W plugs P1 to P4, P6, P7, P9, and P11 are simultaneously formed, as with W plugs P5, P8, P10, P12, and P13.

FIGS. 18A and 18B:

The first level wiring layer 122 and the second level wiring layer 125 or the like are formed.

Specifically, Ti/TiN/Al/Ti/TiN (not shown) are first sequentially deposited, by sputtering, with a film thickness of about 30 nm/about 50 nm/about 400 nm/about 5 nm/about 50 nm, respectively.

Subsequently, Ti/TiN/Al/Ti/TiN are patterned by lithography and dry etching to form the first level wiring layer 122. In the illustrated example, a wiring W1 connected to W plug P5 and TG line 1 of TG-Tr1 connected to W plug P1 (furthermore, there exists the Vr2 line of the sensor unit which is adjacent to the far left end of the diagram), in A, are illustrated as elements of the first level wiring layer 122. In B, wiring W4 connected to W plug P8, wiring W3 connected to W plug P7, SL line of SL-Tr connected to W plug P9, and wiring W5 connected to W plug P10 are illustrated. In addition, the first level wiring layer 122 includes TG line 2 of TG-Tr2 connected to W plug P2, wiring W2 connected to W plug P6, TG line 3 of TG-Tr3 connected to W plug P3, TG line 4 of TG-Tr4 connected to W plug P4, RS line of RS-Tr connected to W plug P11, wiring W6 connected to W plug P12, and Vr2 line connected to plug P13.

Next, a silicone oxide film (e.g. HDP plasma oxide film) and a silicon oxide film (e.g. plasma oxide film) are laminated with a film thickness of about 750 nm and about 1100 nm, respectively, so as to cover the first level wiring layer 122 to form an interlayer insulator film 123. Subsequently, the surface of the interlayer insulator film 123 is polished by the CMP method to flatten the surface of the interlayer insulator film 123.

Next, a resist mask (not shown) is formed to partially expose the surface of the interlayer insulator films 123 aligned with wiring W1 in A, and wirings W4, W3, and W5 in B. Using this resist mask, the interlayer insulator film 123 is patterned to form respective contact holes 124 which expose a part on the wiring W1 in A, and the wirings W4, W3, and W5 in B. The resist mask is removed by ashing or the like.

Next, an adherence film (not shown), namely Ti/TiN here, is formed by sputtering with a film thickness of about 30 nm/about 50 nm over the entire surface so as to cover the internal wall surface of respective contact holes 124. Subsequently, tungsten (W) is deposited by the CVD method over the entire surface via the adherence film so as to bury respective contact holes 124.

Then, the deposited W is polished by the CMP method with the surface of the interlayer insulator film 123 used as the polishing stopper. This polishing forms, a W plug P22 in the contact hole 124 in A, W plugs P21, P24 and P26 in the contact hole 124 in B, respectively. Here, W plugs P22 to P23, and P25 are simultaneously formed, as with W plugs P21, P22, P24, and P26.

Next, Ti/TiN/Al/Ti/TiN (not shown) are sequentially deposited, by sputtering, with a film thickness of about 30 nm/about 50 nm/about 400 nm/about 5 nm/about 50 nm, respectively.

Subsequently, Ti/TiN/Al/Ti/TiN are patterned by lithography and dry etching to form the second level wiring layer 125. The second level wiring layer 125 is composed of a Vr1 line, an SF-FD connection line, and an SG line extending approximately in parallel along the column direction. In the illustrated example, the SF-FD connection line connected to W plug P22 and the SG line connected by plug P26, in A, are illustrated as elements of the second level wiring layer 125. In B, the Vr1 line connected to W plug P21, the SF-FD connection line connected to W plug P24, and the SG line connected to W plug P26 are illustrated.

Next, a silicone oxide film (e.g. HDP plasma oxide film) and a silicon oxide film (e.g. plasma oxide film) are laminated with a film thickness of about 750 nm and about 1100 nm, respectively, so as to cover the second level wiring layer 125 to form an interlayer insulator film 126. Subsequently, the surface of the interlayer insulator film 126 is polished by the CMP method to flatten the surface of the interlayer insulator film 126.

Subsequently, though not shown, after a third level wiring layer is formed on respective formation regions except the formation region in A, an interlayer insulator film 127 having a flattened surface similarly with the interlayer insulator films 123 and 126 is formed thereon.

Then, a silicon nitride film is deposited on the interlayer insulator film 127 by the plasma CVD method to form a cover film 128.

FIG. 19:

Subsequently, a color filter 129 and a microlens 130 are formed to complete the CMOS image sensor including the sensor unit.

Specifically, after a color filter 129 is formed on the cover film 128 of the area aligned with each of PD1 to PD4, namely PD1 in the illustrated example, a microlens 130 is formed to be assembled as a camera module. In the above manner, a CMOS image sensor including a sensor unit according to the present embodiment is completed.

As described above, according to the present embodiment, a compact and highly reliable CMOS imaging device is realized, with the device intended to be downsized/miniaturized by employing an arrangement for sharing the signal voltage reading unit between four photoelectric conversion units, while realizing a highly precise reading operation by disposing each of PD1 to PD4 at intervals as even as possible to suppress signal voltage variation.

[Variations]

Now, several variations of the first embodiment will be described.

(Variation 1)

Variation 1, employs an arrangement generally similar to the CMOS image sensor described in the first embodiment, however, difference exists in the shape of the SF-FD connection line in the second level wiring layer.

Figure 20:
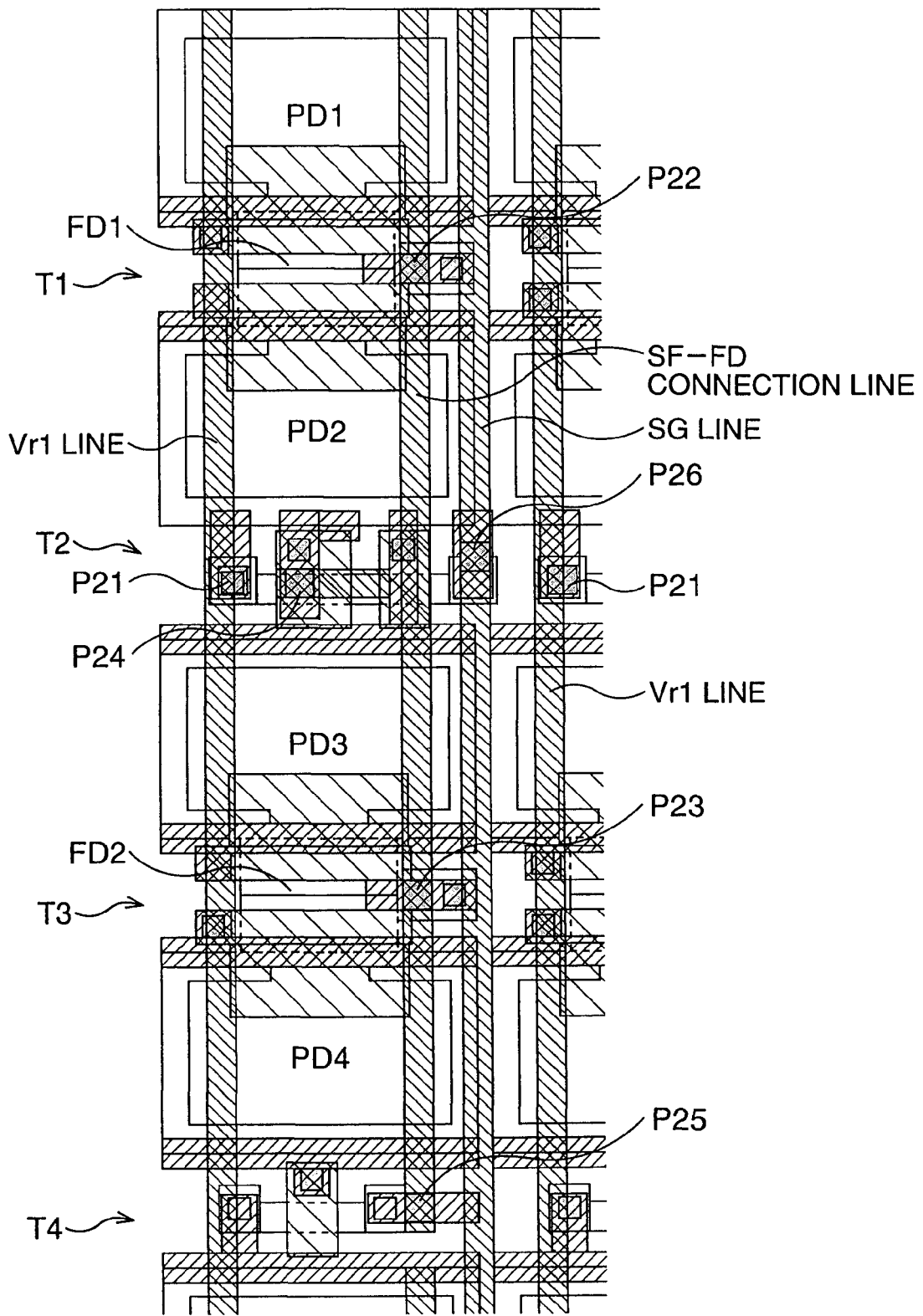
FIG. 20 is a schematic plan view illustrating how the second level wiring layer is formed on the sensor unit in the CMOS image sensor of variation 1.

FIG. 20 is a schematic plan view illustrating how the second level wiring layer is formed on the sensor unit in the CMOS image sensor of variation 1.

The sensor unit of this variation includes, similarly with the first embodiment, a Vr1 line to which reset voltage Vr1 is applied, an SF-FD connection line for connecting SF-Tr and FD1, 2, and an SG line for outputting the signal charge are disposed as elements of the second level wiring layer. The SF-FD connection line, the SG line, and the Vr1 line are adjacently disposed in this order, between sensor units which are adjacent along the row direction.

In this variation, the SF-FD connection line extends so as to cross over PD1 (to be partially overlapping with PD1 to PD4 as seen from the top view), thus the SG line does not have a protrusion. Therefore, in this sensor unit, the Vr1 line, the SF-FD connection line, and the SG line are of the same width and formed to cross over PD1 to PD4 with similar overlapping areas.

With the above arrangement, the capacity created between the SF-FD connection line and the lines TG1, TG2, TG3, and TG4 will be completely equal, in addition to the effects of the first embodiment. Therefore, influence on the FD-SF line by the switching ON/OFF of the lines TG1 to TG4 becomes completely equal, when reading the signal charge from respective PDs, PD1 to PD4, making it possible to prevent generation of signal voltage difference between the four PDs to be shared.

(Variation 2)

Variation 2 employs an arrangement generally similar to the CMOS image sensor described in the first embodiment, however, it differs in that the lines Vr1 and Vr2 are connected.

Figure 21:
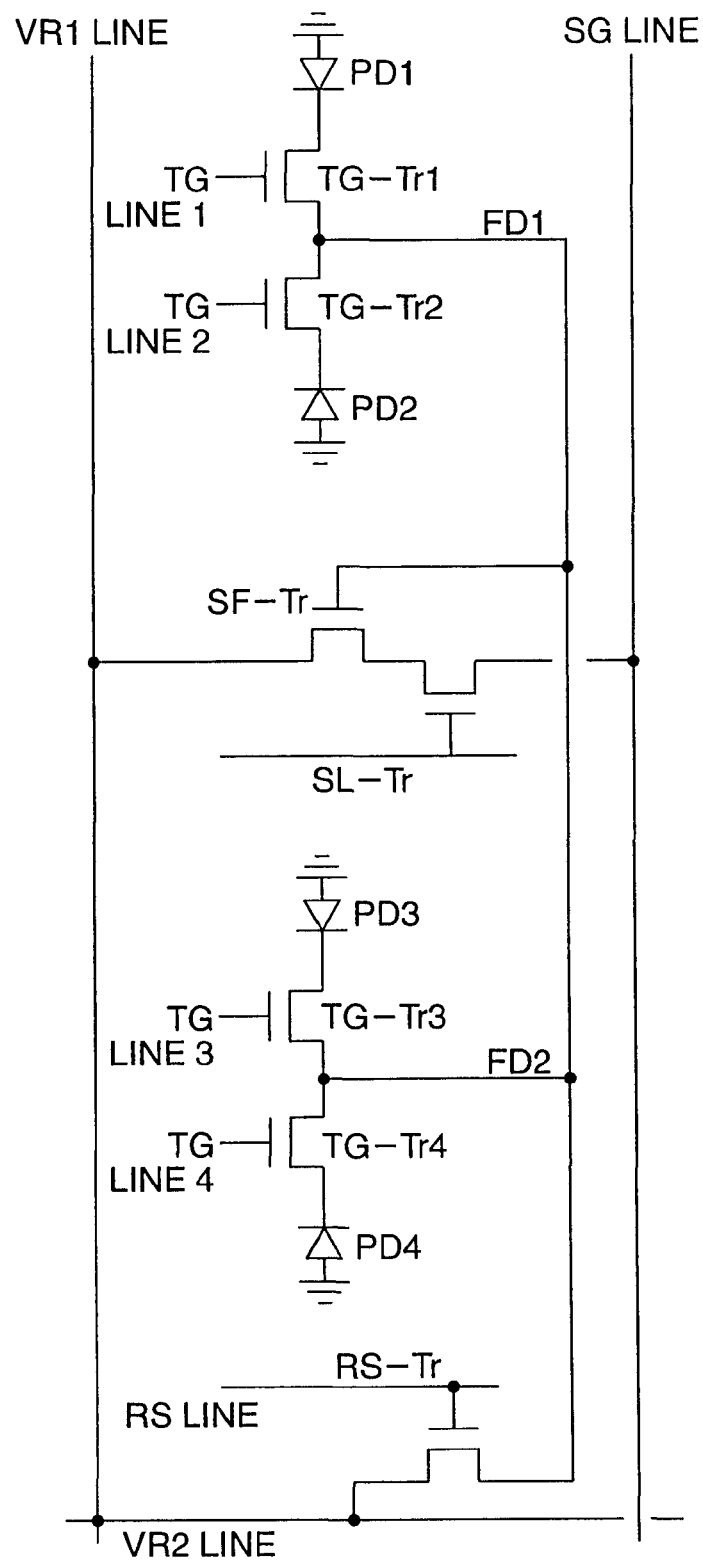
FIG. 21 is an equivalent circuit diagram of the sensor unit in the CMOS image sensor of variation 2.

FIG. 21 is an equivalent circuit diagram of the sensor unit in the CMOS image sensor of variation 2.

In the sensor unit of this variation, the Vr1 line which is an element of the second level wiring layer and extending along in the column direction is electrically connected to the Vr2 line which is an element of the first level wiring layer and extending along the row direction by a W plug (not shown). Therefore, the same reset voltage (Vr1=Vr2) will be applied to the Vr1 Line and Vr2 Line. If both are connected at all of the intersections of the Vr1 line and the Vr2 Line, it is also possible to apply the same reset voltage on all of the pixels arranged matrix-wise, in a mesh-like manner.

With the above arrangement, reset voltage can be supplied very stably to respective pixels arranged in a matrix-like pattern in addition to the effects of the first embodiment.

Second Embodiment

Next, the second embodiment will be described. The present embodiment employs an arrangement generally similar to the CMOS image sensor described in the first embodiment, however, difference exists in the manner by which respective transistor structures composing the signal voltage reading unit are distributed.

Figures 22A, 22B:
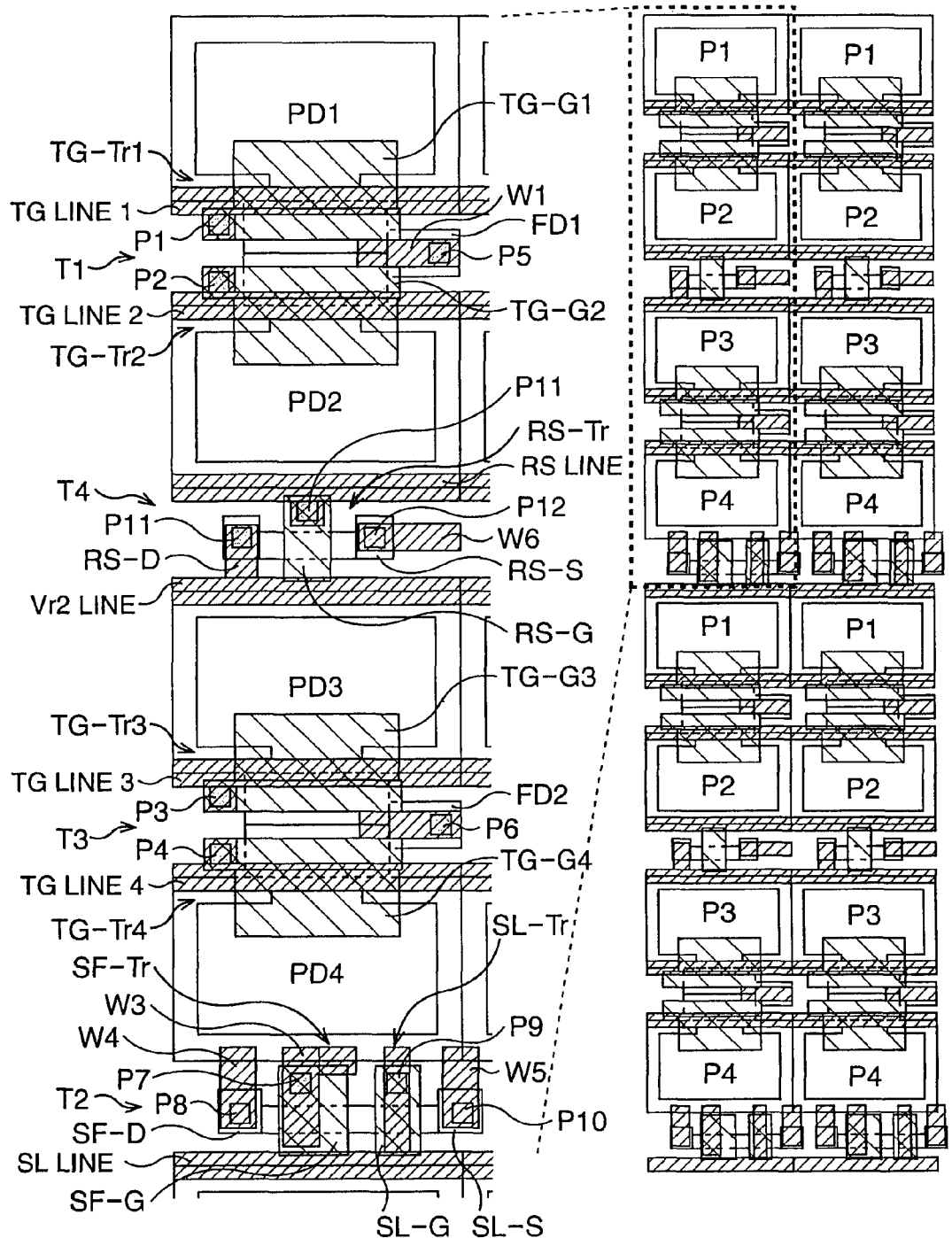
FIGS. 22A and 22B are schematic plan views illustrating the CMOS image sensor according to the second embodiment.

FIGS. 22A and 22B are schematic plan views illustrating a CMOS image sensor according to the second embodiment, wherein A is a schematic plan view illustrating the arrangement of the sensor unit in detail, and B is a schematic plan view illustrating the arrangement of four sensor units (inside of the dashed line corresponds to a sensor unit) in detail.

The basic structure of the sensor unit of the present embodiment is composed of, as shown in FIG. 22A, PD1 to PD4 disposed in alignment along the column direction, a transistor structure T1 disposed between PD1 and PD2, a transistor structure T4 disposed between PD2 and PD3, a transistor structure T3 disposed between PD3 and PD4, and a transistor structure T2 disposed adjacent to PD4 (between PD4 and PD1 of the sensor unit of the subsequent stage).

In other words, the order of disposition in this sensor unit is PD1/FD1, TG-Tr1, 2/PD2/RS-Tr/PD3/FD2, and TG-Tr3, 4/PD4/SF-Tr, and SL-Tr.

As thus described, with the sensor unit in the CMOS image sensor of the present embodiment, SF-Tr, RS-Tr, and SL-Tr which compose the signal voltage reading unit are suitably distributed and disposed as two groups, namely, the transistor structure T4 (RS-Tr) and the transistor structure T2 (SF-Tr and SL-Tr), as well as transistor structures T1 and T3 are suitably disposed. In other words, respective PDs have transistor structures inserted at the upper and lower boundaries between their adjacent PDs. As a result, referring to, for example, the four sensor units disposed in alignment as shown in FIG. 22B, the transistor structure T2 is disposed between PD4 of one sensor unit and PD1 of the other sensor unit, whereby disposing eight PDs at intervals as even as possible, in the two sensor units aligned along the column direction. Therefore, in view of the entire pixel array with a plurality of PDs arranged in a matrix-like pattern, an arrangement is realized in which all of the PDs are disposed at intervals as even as possible.

As thus described, with the sensor unit in the CMOS image sensor of the present embodiment, a layout becomes possible such that the size of respective transistor structures can be made larger than the case (for example, the case in Patent Document 2) in which the transistor structures T1 to T4 composing the signal voltage reading unit are integrated in a single location, whereby enabling reading of the signal charge with less variation among respective pixels.

Figure 23A:
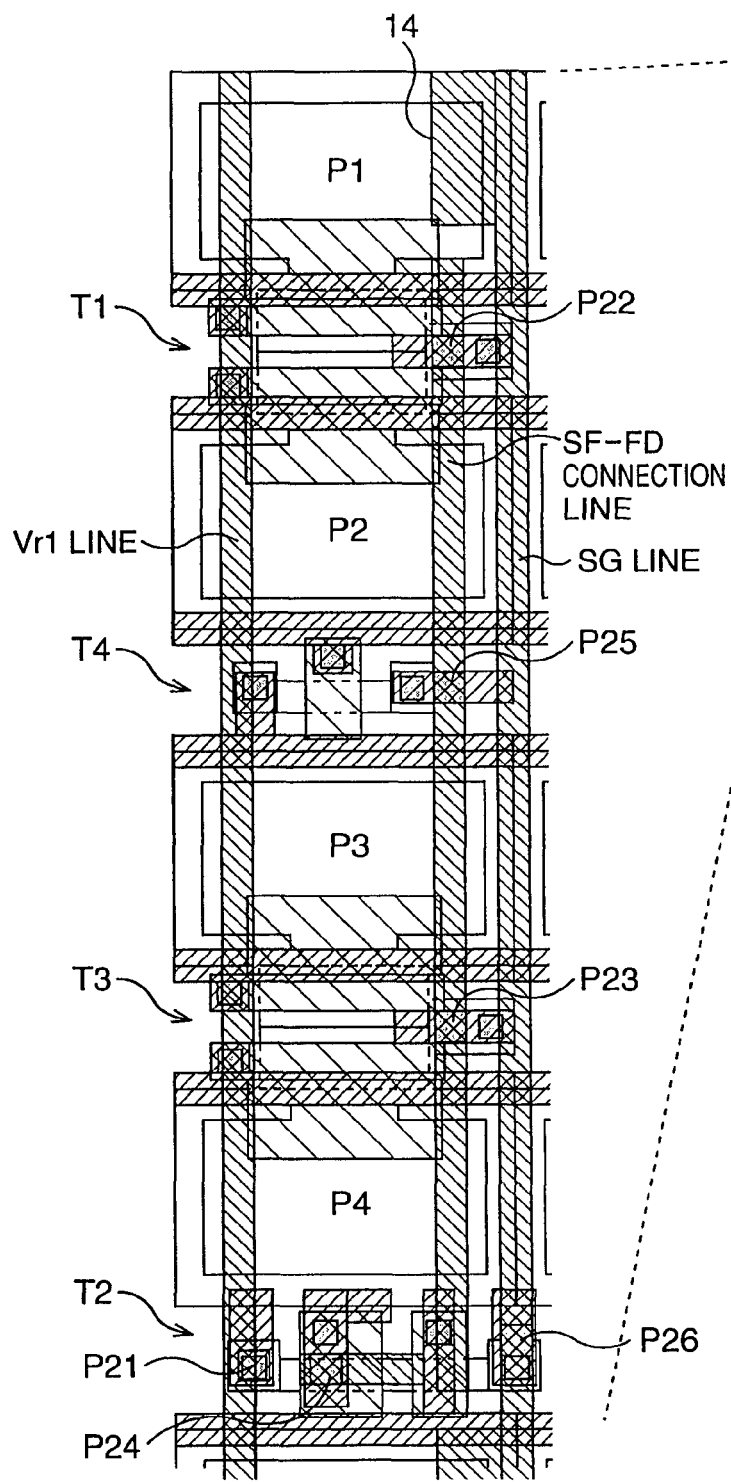
FIGS. 23A and 23B are schematic plan views illustrating how the second level wiring layer is formed on the sensor unit according to the second embodiment.
Figure 23B:
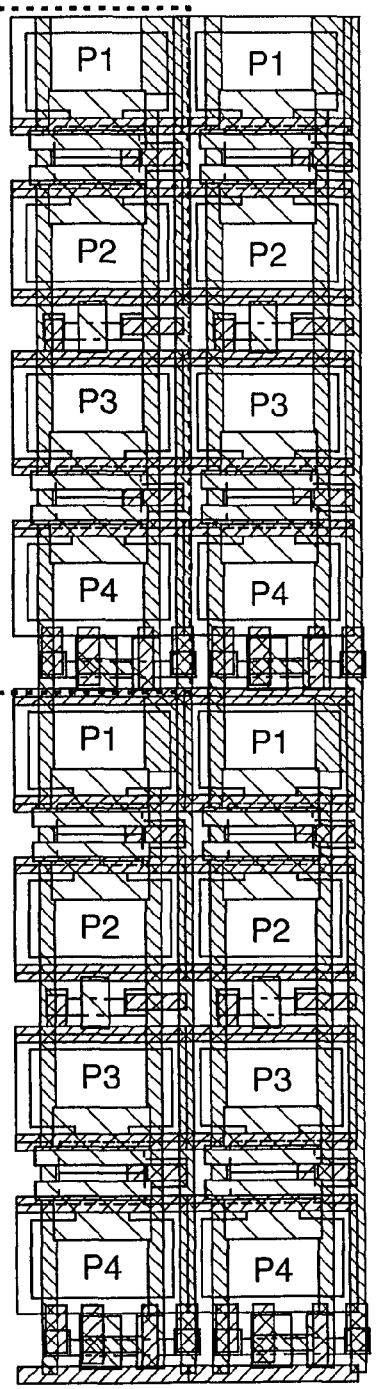
Figure 24B:
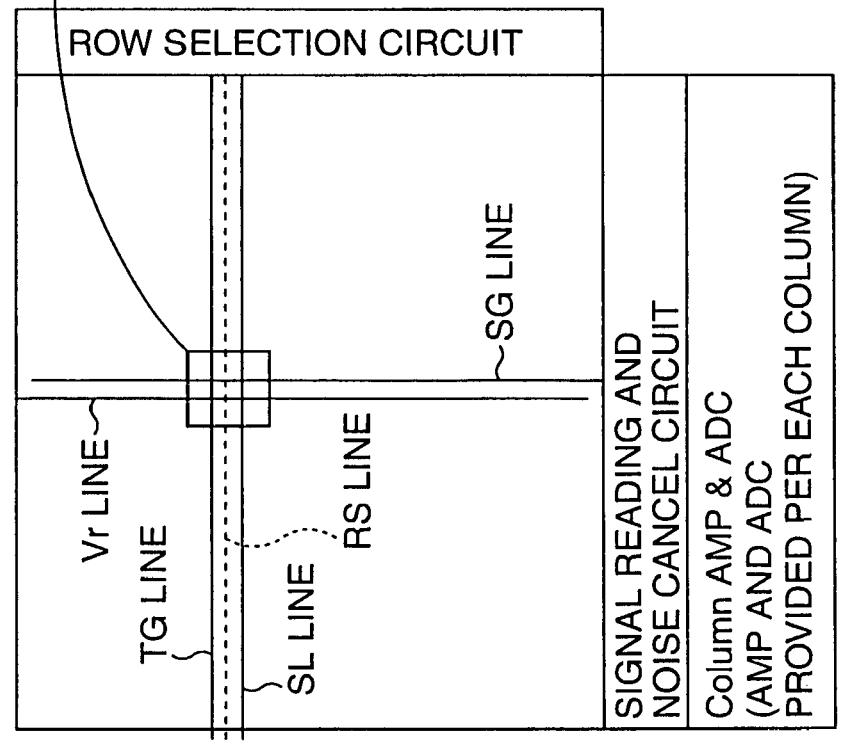
FIGS. 24A and 24B are schematic view drawings illustrating the arrangement of pixels composing the conventional 4Tr-APS.
Figure 24A:
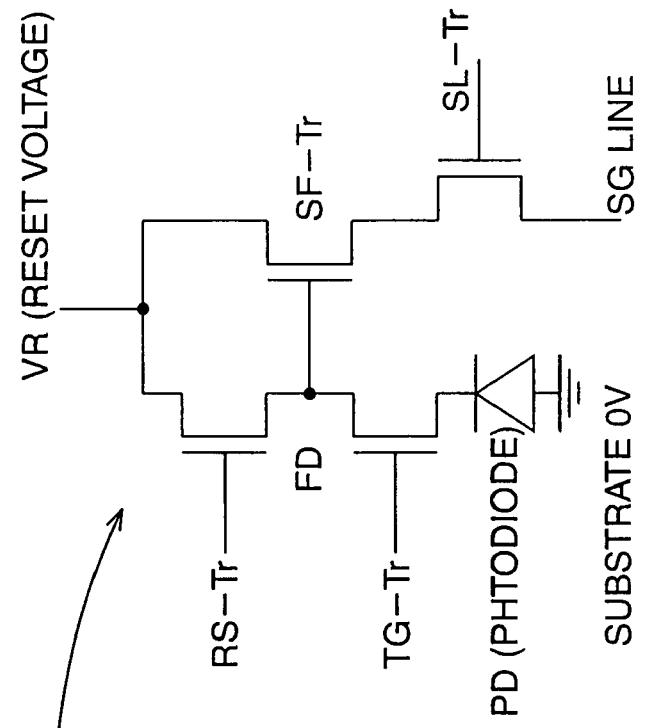
Figure 25:
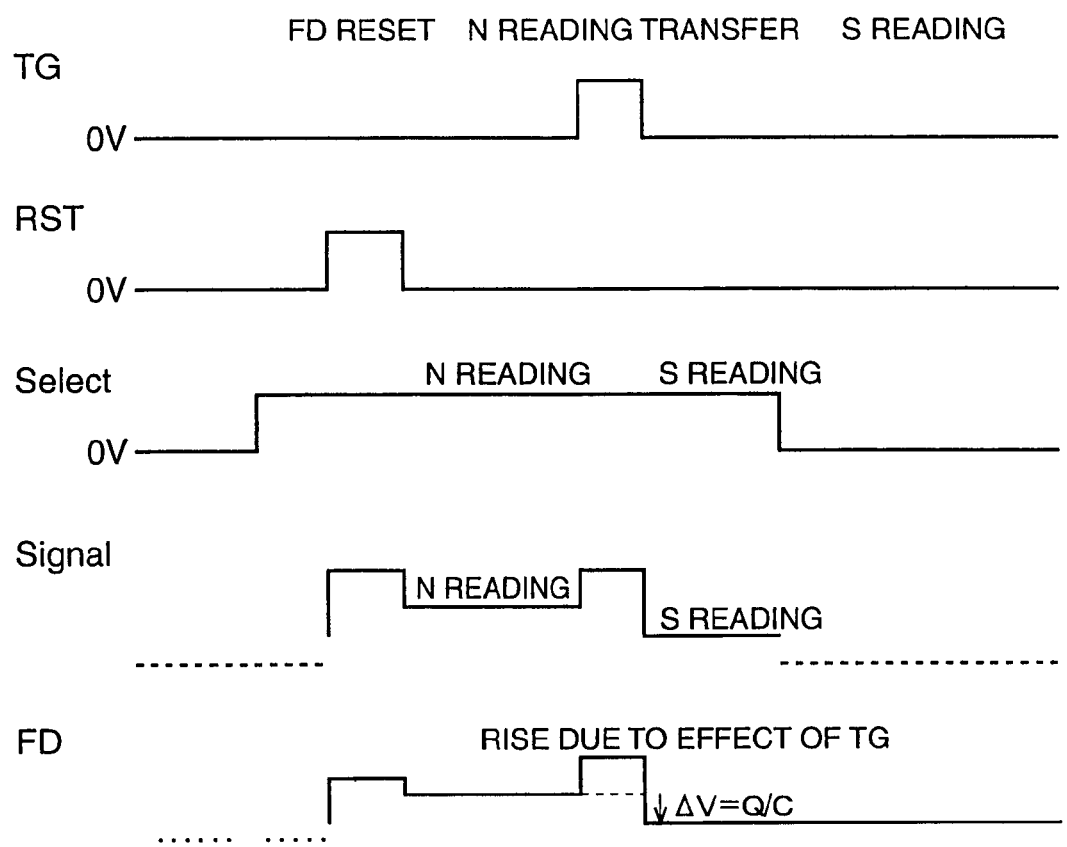
FIG. 25 is a characteristic chart illustrating an example of the conventional 4Tr-APS operating sequence.

FIGS. 23A and 23B are schematic plan views illustrating how the second level wiring layer is formed on the sensor unit of the second embodiment, wherein A is a schematic plan view illustrating details of the arrangement of the sensor unit, and B is a schematic plan view illustrating details of the four sensor units (inside of the dashed line corresponds to a single sensor unit).

The sensor unit of the present embodiment has, a Vr1 line to which reset voltage Vr1 is applied, an SF-FD connection line for connecting SF-Tr and FD1, 2, and an SG line for outputting the signal charge disposed therein as elements of the second level wiring layer.

The Vr1 line is connected to a wiring W4 by a plug P21. Accordingly, the Vr1 line is connected to SF-D of SF-Tr.

This Vr1 Line is formed along the column direction into a band-like shape with approximately the same width.

The SF-FD connection line is connected to: wiring W1 by plug P22; wiring W2 by plug P23; wiring W3 by plug P24; and wiring W6 by plug P25. As described above, wiring W1 is connected to FD1 by plug P5, wiring W2 is connected to FD2 by plug P6, wiring W3 is connected to SF-G by plug P7, and wiring W6 is connected to RS-S by plug P12. Accordingly, the SF-FD connection line is connected to SF-G of SF-Tr, and FD1, 2 and RS-S of RS-Tr.

The SF-FD connection line is partially overlapping as seen from the top view with PD2 to PD4, i.e. the adjacent elements among PD1 to PD4 composing the sensor unit, as well as with TG line 1 to TG line 4, whereas line SF-FD is not overlapping with PD1 as seen from the top view.

The SG line is connected to a wiring W5 by a plug P26. Accordingly, the SG line is connected to SL-S of SL-Tr.

The SG line has a protrusion 14 toward PD so as to be partially overlapping with PD1 as seen from the top view.

As described above, according to the present embodiment, a compact and highly reliable CMOS imaging device is realized, with the device intended to be downsized/miniaturized by employing an arrangement for sharing the signal voltage reading unit between four photoelectric conversion units, while realizing a highly precise reading operation by disposing each of PD1 to PD4 at intervals as even as possible to suppress signal voltage variation.

As thus, the present invention has been described referring to the embodiments, to which however, the present invention is not limited.

For example, although a structure has been described as the transistor structure T2 of FIG. 7, in which connection is made in the order of VR1 line, SF-Tr, SL-Tr, SG line in the first and the second embodiments, a structure may be employed, in which SF-Tr and SL-Tr are replaced to provide a connection in the order of VR1 line, SL-Tr, SF-Tr, SG line. This case also allows row selection by SL-Tr and the effect that each of PD1 to PD4 can be disposed at intervals as even as possible remains unchanged.

Additionally, for example, a method is known to omit the SL-Tr by changing the FD voltage between the selected row and a non-selected row when reading a signal (see "2 um cell/MOS image sensor using a-Si color filter", The Institute of Image Information and Television Engineers, Technical Report Vol. 29, No. 24, PP 0.21-24). Also with a pixel structure which does not use a SL-Tr, the effect that PD1 to PD4 can be disposed at intervals as even as possible, similarly with the first and the second embodiments, remains unchanged if a transistor structure T2 is provided so as to include only the SF-Tr.

According to the present invention, a compact and highly reliable semiconductor imaging device is provided, with the device intended to be downsized/miniaturized by employing an arrangement for sharing the signal voltage reading unit between four photoelectric conversion units which are adjacent along the column direction, while realizing a highly precise reading operation by disposing respective photoelectric conversion units at intervals as even as possible to suppress signal voltage variation.

What is claimed is:

1. A semiconductor imaging device having a plurality of pixels arranged in a matrix-like pattern, each of said pixels comprising:
   a first photoelectric conversion unit, a second photoelectric conversion unit, a third photoelectric conversion unit and a fourth photoelectric conversion unit for converting received light into signal charge;
   a first signal voltage conversion unit and a second voltage conversion unit for converting said signal charge into voltage;
   a first transistor for controlling said signal charge to be transferred from said first photoelectric conversion unit, said second photoelectric conversion unit, said third photoelectric conversion unit and said fourth photoelectric conversion unit to said first signal voltage conversion unit and said second voltage conversion unit;
   a signal voltage read-out unit having:
      a second transistor for regulating voltage of said first signal voltage conversion unit and said second signal voltage conversion unit into a second reset voltage;
      a third transistor for outputting signal voltage according to said voltage of said first signal voltage conversion unit and said second voltage conversion unit; and
      a fourth transistor for selecting a row to which said pixel belongs,
   wherein said first photoelectric conversion unit, said second photoelectric conversion unit, said third photoelectric conversion unit and said fourth photoelectric conversion unit aligned along the column direction share said signal voltage read-out unit, with the elements disposed in the order of: said first photoelectric conversion unit, said first signal voltage conversion unit and two of said first transistors, said second photoelectric conversion unit, said second transistor, said third photoelectric conversion unit, said second signal voltage conversion unit and two of said first transistors, said fourth photoelectric conversion unit, said third transistor and said fourth transistor.

2. The semiconductor imaging device according to claim 1 further comprising:
   a first wiring layer having a transfer wiring connected to the gate electrode of said first transistor, a reset wiring connected to the gate electrode of said second transistor, and a selection wiring connected to the gate electrode of said fourth transistor, each of which extending along the row direction; and
   a second wiring layer formed on the top surface of said first wiring layer and comprising:
   a first reset voltage wiring electrically connected to the drain electrode of said third transistor to provide first reset voltage; a connection wiring connected to the gate electrode of said third transistor as well as to said first signal voltage conversion unit and said second voltage conversion unit; and
   a signal wiring electrically connected to the source electrode of said third transistor, respectively disposed in alignment in this order, each of which extending in alignment along the column direction, wherein the clearance between said first reset voltage wiring and said connection wiring is larger than the clearance between said connection wiring and said signal wiring in said second wiring layer.

3. The semiconductor imaging device according to claim 2, wherein
   said connection wiring is partially overlapping as seen from the top of view with said second photoelectric conversion unit, said third photoelectric conversion unit and said fourth photoelectric conversion unit, as well as with said transfer wirings, whereas said connection wiring is not overlapping as seen from the top of view with said first photoelectric conversion unit, and
   said signal wiring has a protrusion toward said photoelectric conversion unit so as to be partially overlapping with said first photoelectric conversion unit as seen from the top view.

4. The semiconductor imaging device according to claim 2, wherein said connection wiring is partially overlapping with said first photoelectric conversion unit, said second photoelectric conversion unit, said third photoelectric conversion unit and said fourth photoelectric conversion unit and said transfer wiring as seen from the top view.

5. The semiconductor imaging device according to claim 2, wherein
   said first wiring layer further comprises a second reset voltage wiring which is connected to the drain electrode of said second transistor extending along the row direction to provide said second reset voltage, and
   said second reset voltage is larger than said first reset voltage, with said first reset voltage wiring and said second reset voltage wiring being disconnected.

6. The semiconductor imaging device according to claim 2, wherein
   said first wiring layer further comprises a second reset voltage wiring which is connected to the drain electrode of said second transistor extending along the row direction to provide said second reset voltage, and
   said first reset voltage wiring and said second reset voltage wiring are connected.

* * * * *